(12) United States Patent
Poelzl

(10) Patent No.: US 9,806,187 B2
(45) Date of Patent: Oct. 31, 2017

(54) METHOD FOR MANUFACTURING A SEMICONDUCTOR DEVICE

(71) Applicant: Infineon Technologies Austria AG, Villach (AT)

(72) Inventor: Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 173 days.

(21) Appl. No.: 13/652,758

(22) Filed: Oct. 16, 2012

(65) Prior Publication Data

US 2013/0040443 A1   Feb. 14, 2013

Related U.S. Application Data

(62) Division of application No. 13/005,694, filed on Jan. 13, 2011, now Pat. No. 8,313,995.

(51) Int. Cl.

| H01L 29/78 | (2006.01) |
|---|---|
| H01L 29/66 | (2006.01) |
| H01L 21/8242 | (2006.01) |
| H01L 21/20 | (2006.01) |
| H01L 29/739 | (2006.01) |
| H01L 29/08 | (2006.01) |
| H01L 29/40 | (2006.01) |
| H01L 29/423 | (2006.01) |

(52) U.S. Cl.
CPC .... *H01L 29/7813* (2013.01); *H01L 29/66734* (2013.01); *H01L 29/7397* (2013.01); *H01L 29/0878* (2013.01); *H01L 29/407* (2013.01); *H01L 29/42368* (2013.01)

(58) Field of Classification Search
CPC .......... H01L 29/66734; H01L 29/7813; H01L 29/0878; H01L 29/42368
USPC .............................. 438/478, 589; 257/E21.09
See application file for complete search history.

(56) References Cited

U.S. PATENT DOCUMENTS

| 5,858,830 A | 1/1999 | Yoo et al. | |
|---|---|---|---|
| 2001/0038121 A1* | 11/2001 | Kim ................... | H01L 29/7813 257/330 |
| 2004/0077176 A1* | 4/2004 | Lin ................... | H01L 21/76224 438/694 |

(Continued)

FOREIGN PATENT DOCUMENTS

| CN | 1930671 A | 3/2007 |
|---|---|---|
| CN | 101180737 A | 5/2008 |
| DE | 102005041108 B3 | 5/2007 |

*Primary Examiner* — Christine Enad
(74) *Attorney, Agent, or Firm* — Murphy, Bilak & Homiller, PLLC

(57) ABSTRACT

A method for forming a semiconductor device is provided. The method includes providing a semiconductor body with a horizontal surface. An epitaxy hard mask is formed on the horizontal surface. An epitaxial region is formed by selective epitaxy on the horizontal surface relative to the epitaxy hard mask so that the epitaxial region is adjusted to the epitaxy hard mask. The epitaxial region is polished by a chemical-mechanical polishing process stopping on the epitaxy hard mask. A vertical trench is formed in the semiconductor body. An insulated field plate is formed in a lower portion of the vertical trench and an insulated gate electrode is formed above the insulated field plate. Further, a method for forming a field-effect semiconductor device is provided.

7 Claims, 40 Drawing Sheets

(56) References Cited

U.S. PATENT DOCUMENTS

| | | | |
|---|---|---|---|
| 2004/0180550 A1* | 9/2004 | Jeng | H01L 21/76235 438/700 |
| 2005/0167742 A1* | 8/2005 | Challa et al. | 257/328 |
| 2006/0097312 A1* | 5/2006 | Poelzl | H01L 29/66734 257/328 |
| 2007/0018241 A1* | 1/2007 | Amali | H01L 29/66719 257/330 |
| 2008/0050877 A1* | 2/2008 | de Fresart et al. | 438/270 |
| 2008/0203428 A1* | 8/2008 | Choi | 257/190 |
| 2009/0233407 A1* | 9/2009 | Disney | 438/268 |
| 2010/0059849 A1* | 3/2010 | Quddus | 257/476 |

\* cited by examiner

METHOD FOR MANUFACTURING A SEMICONDUCTOR DEVICE

PRIORITY CLAIM

This application is a Divisional of U.S. application Ser. No. 13/005,694, filed on Jan. 13, 2011, the content of said application incorporated herein by reference in its entirety.

TECHNICAL FIELD

This specification refers to embodiments of manufacturing methods for semiconductor devices, in particular trench gate field effect semiconductor devices with reduced Miller capacitance.

BACKGROUND

Many functions of modern devices in automotive, consumer and industrial applications, such as computer technology, mobile communications technology, converting electrical energy and driving an electric motor or an electric machine, rely on field effect semiconductor transistors.

In order to improve the transistor switching speed and/or to reduce losses there are, in addition to further progresses in downscaling the transistor dimensions, ongoing developments to reduce parasitic device capacitances such as the Miller capacitance which is related to the gate-drain charge Qgd between the gate electrode and the drain region of the field effect transistor. The gate-drain charge Qgd is proportional to the overlap area and inversely proportional to the thickness of the gate dielectric along the gate electrode.

Several methods to reduce Qgd have been proposed, in particular for trench gate field effect transistors with insulated gate electrodes arranged in trenches. These methods include reducing the trench width, using a thicker dielectric along the trench bottom, eliminating portions of the gate along the trench flat bottom portion, extending the p-type well region of n-channel field effect transistors slightly deeper than the gate trench, and arranging an additional p-type region directly below the gate trench of n-channel field effect transistors. Each of these techniques has its own advantages and disadvantages. Some require a more complex process technology, while others are not so effective in reducing Qgd without adversely impacting other device characteristics. Furthermore, it is often required to minimize the Qgd variations related to varying processing conditions, for example to improve reliability and/or to minimize Miller capacitance variations of different gate electrodes of a power semiconductor device.

SUMMARY

According to an embodiment, a method for forming a semiconductor device is provided. The method includes providing a semiconductor body with a horizontal surface. An epitaxy hard mask is formed on the horizontal surface. An epitaxial region is formed by selective epitaxy on the horizontal surface relative to the epitaxy hard mask so that the epitaxial region is adjusted to the epitaxy hard mask. A vertical trench is formed in the semiconductor body. An insulated field plate is formed in a lower portion of the vertical trench and an insulated gate electrode is formed above the insulated field plate. Forming an insulated field plate includes forming a field oxide. The field oxide extends, in a vertical direction, up to the epitaxial region.

According to an embodiment, a method for forming a semiconductor device is provided. The method includes providing a semiconductor body with a horizontal surface. An epitaxy hard mask is formed on the horizontal surface. A semiconductor material is deposited on the semiconductor body by epitaxial deposition selective to the epitaxy hard mask by selective epitaxy so that, in a vertical cross-section, at least two spaced apart epitaxial regions are formed. Typically, the semiconductor material is polished back to the epitaxy hard mask after selective epitaxy. The epitaxy hard mask is removed selective to the semiconductor material so that, in the vertical cross-section, the sidewalls of the at least two spaced apart epitaxial regions are exposed. A trench hard mask is formed. The trench hard mask includes, in the vertical cross-section, a dielectric layer, for example a nitride layer, on each of the sidewalls of the epitaxial regions. A vertical trench is etched into the semiconductor body using the trench hard mask as etching mask. An insulated gate electrode is formed which is, in the vertical cross-section, arranged between the at least two spaced apart epitaxial regions.

According to an embodiment, a method for forming a semiconductor device is provided. The method includes providing a semiconductor body with a horizontal surface. An epitaxy hard mask is formed on the horizontal surface by thermal oxidation and photolithography. A semiconductor material is deposited on the semiconductor body by epitaxial deposition selective to the epitaxy hard mask by selective epitaxy so that, in a vertical cross-section, at least two spaced apart epitaxial regions are formed. Typically, the semiconductor material is polished back to the epitaxy hard mask after selective epitaxy. The epitaxy hard mask is removed selective to the semiconductor material so that, in the vertical cross-section, the sidewalls of the at least two spaced apart epitaxial regions are exposed. A trench hard mask is formed. The trench hard mask includes, in the vertical cross-section, a dielectric layer, for example a nitride layer, on each of the sidewalls of the epitaxial regions. A vertical trench is etched into the semiconductor body using the trench hard mask as etching mask. A field plate is formed in a lower portion of the vertical trench. An insulated gate electrode is formed which is, in the vertical cross-section, arranged between the at least two spaced apart epitaxial regions.

According to an embodiment, a method for forming a semiconductor device is provided. The method includes providing a semiconductor body with a horizontal surface. A trench hard mask is formed on the horizontal surface and a vertical trench is formed self-aligned to the trench hard mask in the semiconductor body. An insulated field plate is formed in a lower portion of the vertical trench. An epitaxy hard mask which is self-aligned to the trench hard mask is formed. The trench hard mask is removed selectively to the epitaxy hard mask to partly expose the semiconductor body. A semiconductor material is deposited on the semiconductor body by epitaxial deposition selective to the epitaxy hard mask by selective epitaxy so that, in a vertical cross-section, at least two spaced apart epitaxial regions are formed. Typically, the semiconductor material is polished back to the epitaxy hard mask after selective epitaxy. The epitaxy hard mask is removed so that, in the vertical cross-section, sidewalls of the at least two spaced apart epitaxial regions are exposed. An insulated gate electrode is formed which is, in the vertical cross-section, arranged between the at least two spaced apart epitaxial regions.

According to an embodiment, a method for forming a semiconductor device is provided. The method includes providing a semiconductor body with a horizontal surface and a hard mask layer arranged on the horizontal surface. A vertical trench is formed in the hard mask layer and the semiconductor body. A field oxide is formed on the side wall and the bottom wall of the vertical trench. A field plate is formed in a lower portion of the vertical trench. An insulating region is formed on the field plate. A liner layer which covers at least the trench hard mask and an upper portion of the field oxide is formed. A dielectric plug is formed in an upper portion of the vertical trench so that the dielectric plug extends beyond the horizontal surface. The trench hard mask is removed to partly expose the semiconductor body. At least two, in a vertical cross-section spaced apart, epitaxial regions are formed on the exposed semiconductor body by selective epitaxy. Typically, the at least two, in the vertical cross-section spaced apart, epitaxial regions are polished back to the dielectric plug after selective epitaxy. In the vertical cross-section, the sidewalls of the at least two spaced apart epitaxial regions are exposed. Exposing the sidewalls of the at least two spaced apart epitaxial regions includes removing the dielectric plug at least between the at least two spaced apart epitaxial regions.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
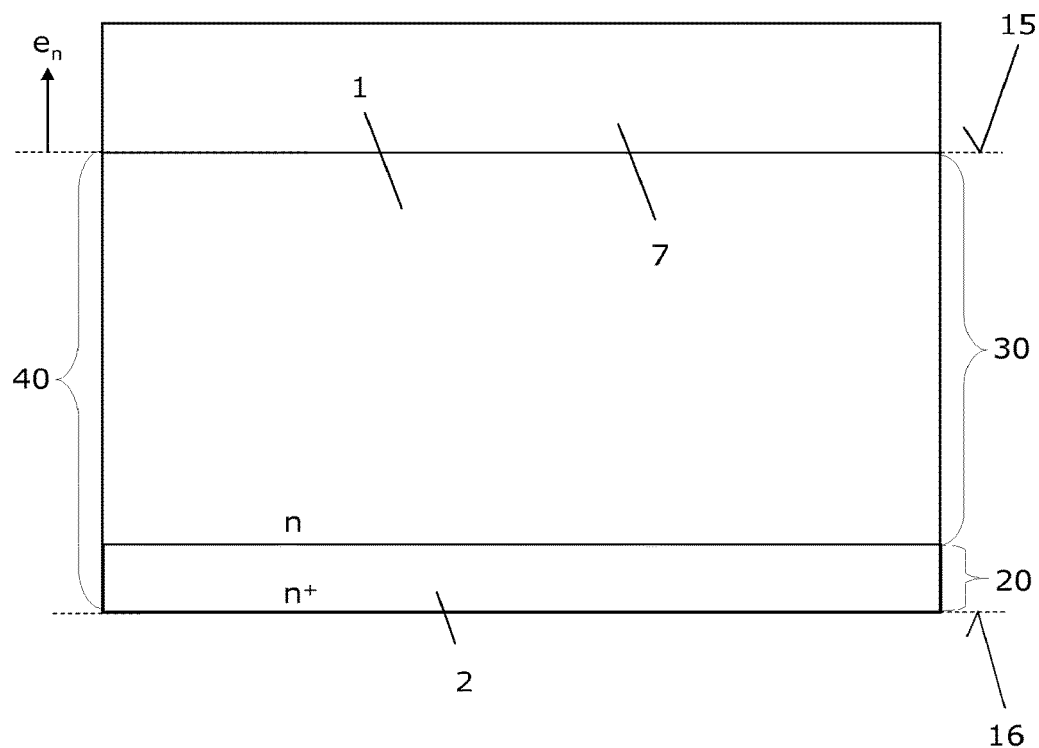
FIGS. 1 to 9 schematically illustrate, in vertical cross-sections, manufacturing processes according to one or more embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, methods for forming semiconductor devices, in particular to methods for forming unipolar or bipolar field effect semiconductor devices. The formed semiconductor device is typically a vertical semiconductor device such as a vertical IGBT, a vertical MOSFET or a vertical JFET (Junction-JET) with an insulated gate electrode arranged in a vertical trench. Typically, the formed semiconductor device is a power semiconductor device having an active area for carrying and/or controlling a load current and a peripheral area with an edge-termination structure to redistribute the electric field and electric potential, respectively, such that the blocking voltage is increased compared to semiconductor devices without the edge-termination structure.

The term "power semiconductor device" as used in this specification intends to describe a semiconductor device on a single chip with high voltage and/or high current switching capabilities. In other words, power semiconductor devices are intended for high current, typically in the Ampere range.

In the context of the present specification, the terms "in ohmic contact", intends to describe an ohmic electric connection or ohmic current path between two regions, portion or parts of a semiconductor devices through the semiconductor device or between different terminals of one or more devices or between a terminal or a metallization and a portion or part of a semiconductor device.

FIGS. 1 to 9 illustrate a method for forming a semiconductor device 100 according to several embodiments in vertical cross-sections. In a first process, a wafer or substrate 40 having a horizontal surface 15 and a first semiconductor layer 1 of the first conductivity type (n-type) is provided. Semiconductor layer 1 extends to the horizontal surface 15. The normal direction $e_n$ of the first surface 15 is substantially parallel to the vertical direction.

The semiconductor body 40 can be a single bulk mono-crystalline material. It is also possible that the semiconductor body 40 includes a bulk mono-crystalline material 20 and at least one epitaxial layer 30 formed thereon. Using the epitaxial layer(s) 30 provides more freedom in tailoring the background doping of the material since the doping concentration can be adjusted during deposition of the epitaxial layer or layers.

In the following, embodiments pertaining to manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

In the exemplary embodiment illustrated in FIG. 1, semiconductor body 40 further includes a second semiconductor layer 2 of the first conductivity which adjoins the first semiconductor layer 1 and extends to a back surface 16 arranged opposite the horizontal surface 15. A maximum doping concentration of the second semiconductor layer 2 is typically higher than a maximum doping concentration of the first semiconductor layer 1. In other embodiments, the second semiconductor layer 2 is of a second conductivity type (p-type).

According to an embodiment, a silicon nitride layer 7 is formed, for example by a LPCVD (low pressure chemical vapor deposition) process on the horizontal surface 15. The silicon nitride layer 7 may be formed directly on the semiconductor body 40 as illustrated in FIG. 1 or on a thin silicon oxide buffer layer formed on the semiconductor body 40.

Thereafter, a photolithographically structured mask is formed on the silicon nitride layer 7. The photolithographically structured mask is used as etching mask to form a trench hard mask 7 and vertical trenches 18, 19 in the semiconductor body 40. Thereafter, the photolithographically structured mask is removed. In so doing, vertical trenches 18, 19 and trench hard mask 7 are self-aligned since the vertical trenches 18, 19 are etched through trench hard mask 7. The resulting semiconductor structure 100 is illustrated in FIG. 2.

Forming trench hard mask 7 and vertical trenches 18, 19 may also be done by two processes, wherein the photolithographically structured mask is already removed after forming the hard trench mask 7 in a first process. In this embodiment, the vertical trenches 18, 19 are etched using only the trench hard mask 7 as an etching mask. Accordingly, the vertical trenches 18, 19 and the trench hard mask 7 are self-aligned since the vertical trenches 18, 19 are etched through the trench hard mask 7. The term "hard mask" as used in this specification intends to describe a structured mask which may be used as a stop of a CMP ("chemical mechanical polishing") process of a semiconductor material, in particular as a stop of a silicon-CMP process. Accordingly, the abrasion rate of the semiconductor material exceeds the abrasion rate of the hard masks during the CMP-process for polishing the semiconductor material, typically by at least a factor of five, more typically by a factor of at least ten at least close to the surface of the hard mask where the CMP-process is to be stopped. Typical materials for the hard mask include silicon oxide ($SiO_2$), silicon nitride (SiN) and silicon oxynitride ($SiO_xN_y$). The hard mask may for example be formed as a thermal silicon oxide layer, a TEOS-layer (TetraEthylOrthoSilicat-layer), an USG-layer (Undoped Silicate Glass-layer), an HDP-oxide-layer (High Density Plasma-oxide layer) or a doped oxide layer, for example a PSG-layer (PhosphoSilicate Glass), a BPSG-layer (BoroPhosphoSilicate Glass) or a BSG-layer (BoroSilicate Glass). The TEOS-layer may be formed as a thermal TEOS or plasma enhanced TEOS (PETEOS).

Figure 2:
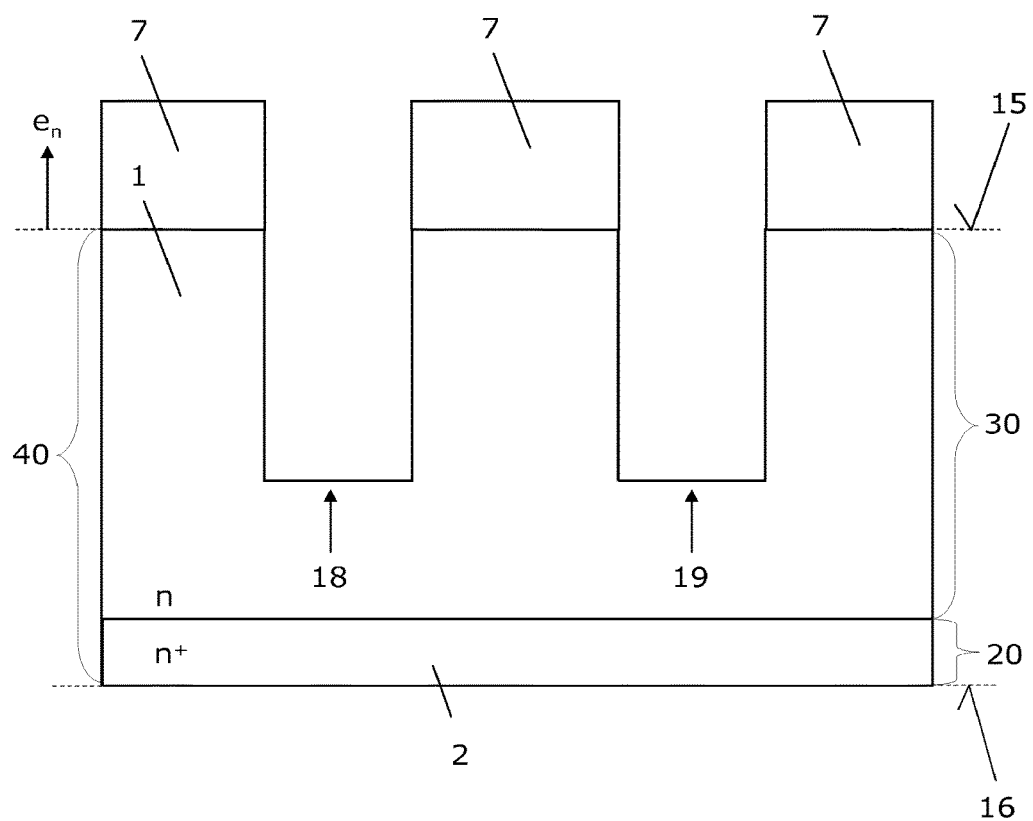

The processes resulting in the semiconductor structure 100 illustrated in FIG. 2, may also be described as two processes. In a first process, a semiconductor body 40 with a horizontal surface 15 and a hard mask layer 7 arranged on the horizontal surface 15 is provided. In a further process, at least one vertical trench 18, 19 is formed in the hard mask layer 7 and the semiconductor body 40.

Thereafter, a field oxide 9 is formed on the side walls and the bottom walls of the vertical trenches 18, 19. The term "field oxide" as used in this specification intends to describe an dielectric region or dielectric layer which covers the side walls and the bottom wall of a vertical trench extending into the semiconductor body to insulate a field plate arranged in the vertical trench from the semiconductor body, where the thickness of the dielectric layer or dielectric region, in normal direction of the interface formed between the semiconductor body and the field oxide is larger than about 100 nm or even larger than about 200 nm. The field oxide is typically formed by thermal oxidation but may also be deposited, for example in a CVD-process. The term "field oxide" intends to describe a "field dielectric" which is used to insulate a field plate. Typically, the field oxide is formed as an oxide, such as silicon oxide, but may also comprise other dielectric materials such as a nitride. In the context of the present specification, the term "field plate" intends to describe an electrode which is arranged next to a semiconductor region, typically a drift region, insulated from the semiconductor region, and configured to expand a depleted portion in the semiconductor region by applying an appropriate voltage, typically a positive voltage for an n-type drift region. The terms "depleted" and "completely depleted" intend to describe that a semiconductor region comprises substantially no free charge carriers. Typically, insulated field plates are arranged close to pn-junctions formed e.g. between a drift region and a body region. Accordingly, the blocking voltage of the pn-junction and the semiconductor device, respectively, may be increased.

Thereafter, a field plate 12 is formed in a lower portion of each of the vertical trenches 18, 19. This may be done by depositing a conductive layer, for example a highly doped poly-silicon layer, and back-etching the conductive layer selectively to the trench hard mask 7 and the field oxide 9. Thereafter, an insulating region 12a is formed on each of the field plates 12, for example by thermal oxidation of an upper portion of the back etched poly-silicon layer. In so doing, an insulated field plate is formed in each of the vertical trenches 18, 19.

Figure 3:
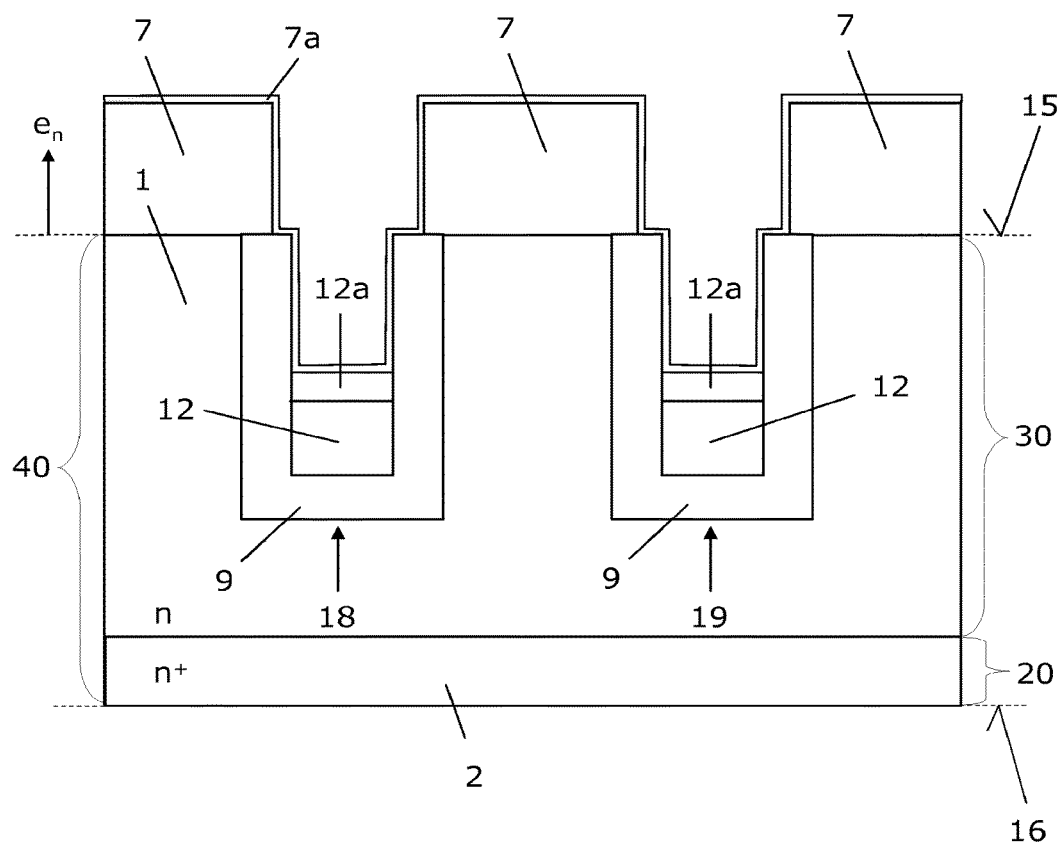

Thereafter, a liner layer 7a is deposited as a conformal layer which covers at least trench hard mask 7 and upper portions of the field oxide 9. The resulting semiconductor structure 100 is illustrated in FIG. 3. Typically, the liner layer 7a has a thickness of about 20 nm to about 40 nm, for example 30 nm. In the exemplary embodiment illustrated in FIG. 3, the liner layer 7a is formed as a silicon nitride layer or silicon oxynitride layer.

Figure 4:
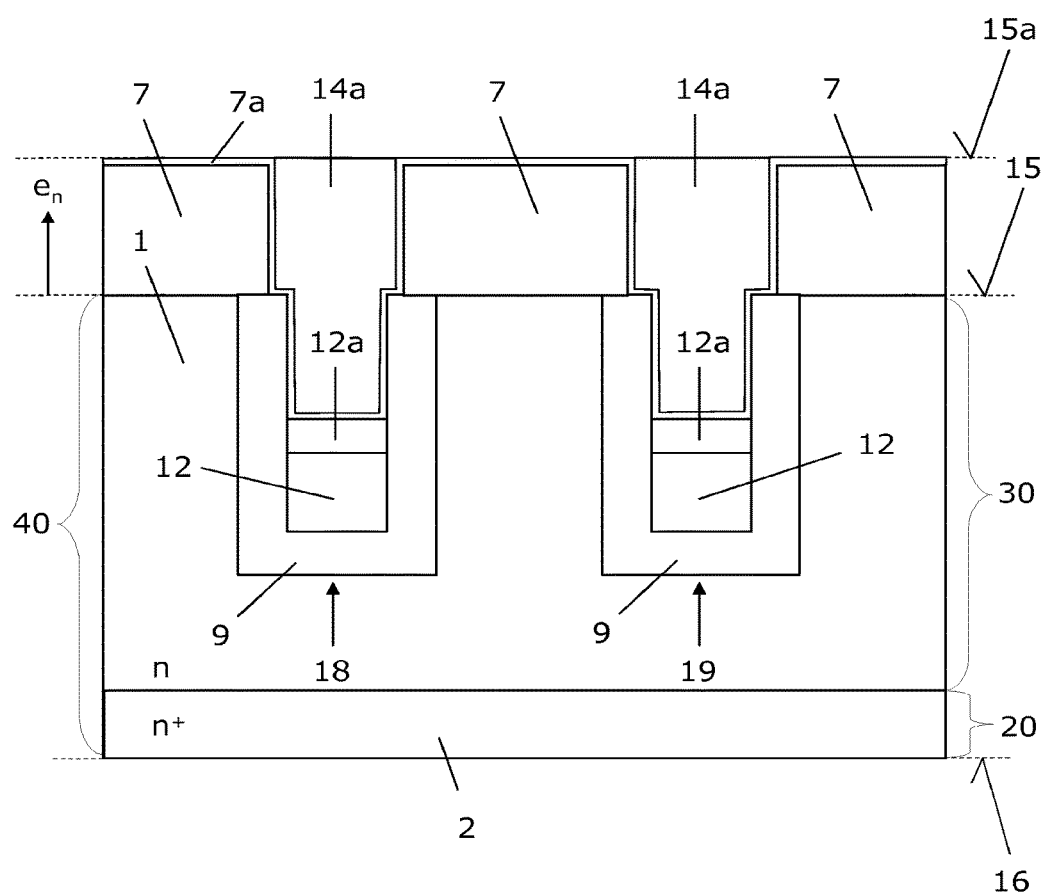

Thereafter, a dielectric plug 14a is formed in an upper portion of each of the vertical trenches 18, 19 so that the dielectric plugs 14a extend beyond the horizontal surface 15 of the semiconductor body 40. The resulting semiconductor structure 100 is illustrated in FIG. 4. Forming the dielectric plugs 14a typically includes depositing a dielectric material, for example a TEOS, and a CMP-process stopping at or close to the liner layer 7a. In so doing, the dielectric plugs 14a extend vertically up to a further horizontal surface 15a. The distance between the horizontal surface 15 of the semiconductor body 40 and the further horizontal surface 15a is substantially defined by the thickness of the hard mask layer 7 and the liner layer 7a.

Figure 5:
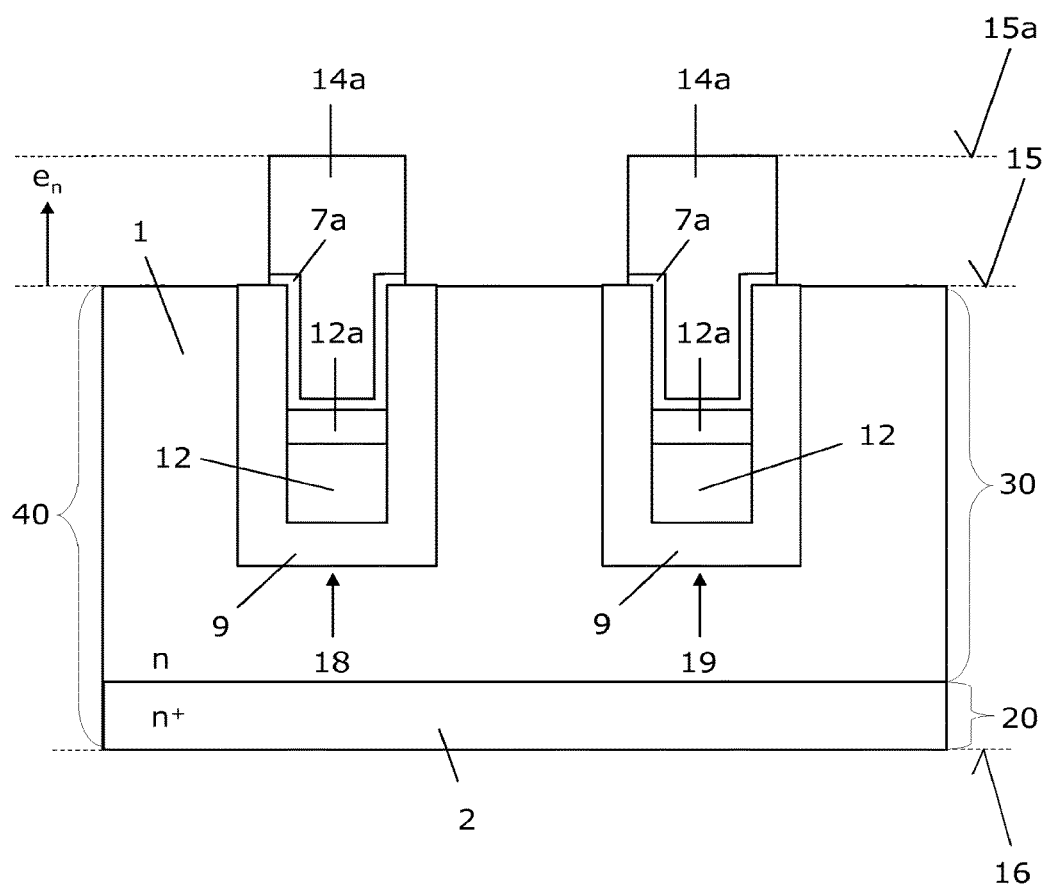

Thereafter, the hard mask 7 and an upper portion of the liner layer 7a are removed. For example, hot phosphoric acid may be used to remove silicon nitride of the hard mask 7 and an upper portion of the liner layer 7a selectively to the material of the dielectric plugs 14a (TEOS or silicon oxide). The resulting semiconductor device 100 is illustrated in FIG. 5. Accordingly, the semiconductor body 40 is partly exposed between adjacent ones of the dielectric plugs 14a which will be used as an epitaxy hard mask 14a in a subsequent process. Typically, the epitaxy hard mask 14a comprises a vertical extension measured from horizontal surface 15 of about 300 nm to about 500 nm.

Figure 6:
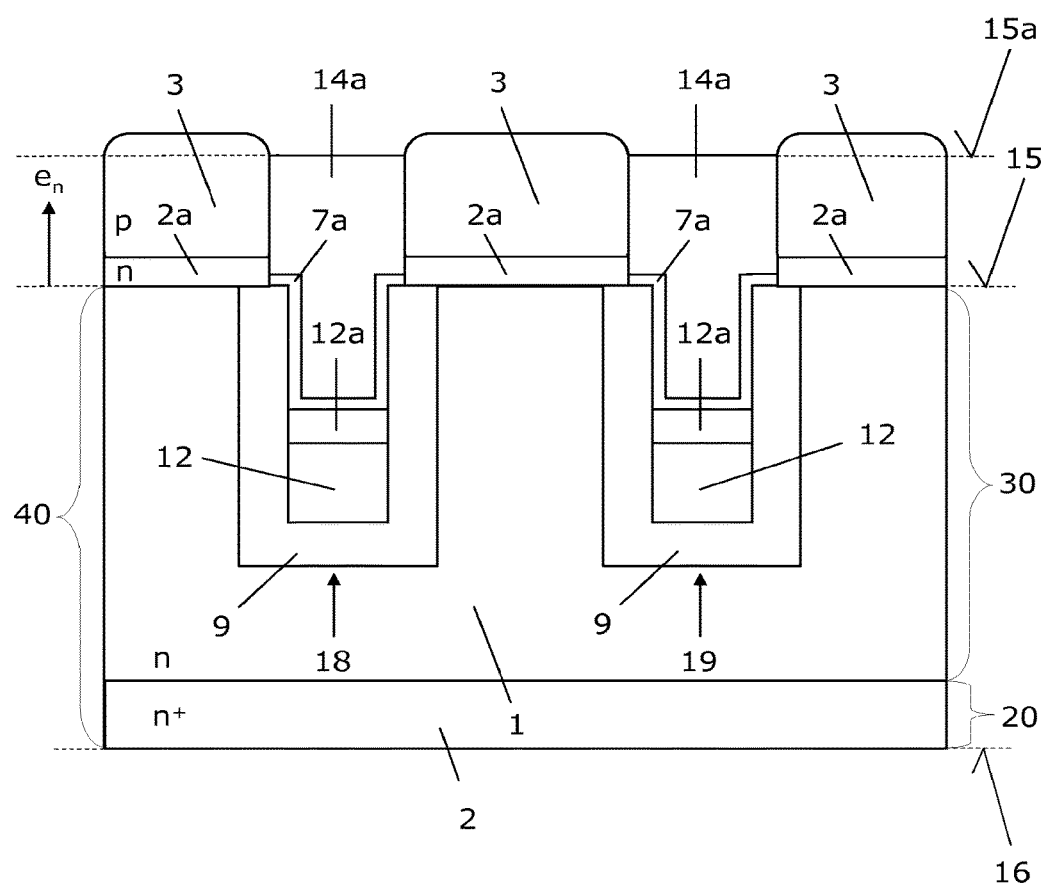

Thereafter, silicon is deposited on the exposed portions of the semiconductor body 40 by an epitaxial deposition which is selective to the epitaxy hard mask formed by the dielectric plugs 14a. This is done by selective epitaxy resulting in a semiconductor device 100 as illustrated in FIG. 6 and an additional silicon-CMP process. Accordingly, the semiconductor material is polished back to the epitaxy hard mask 14a so that, in the illustrated vertical cross-section, at least two spaced apart epitaxial regions 2a, 3 are formed which extend, in the vertical direction, substantially up to the further horizontal surface 15a. The term "selective epitaxy" as used in this specification intends to describe an epitaxial process based e.g. on CVD (chemical vapor deposition), MBE (molecular beam epitaxy), or SPE (solid phase epitaxy) in which the semiconductor body is single crystal and partially covered by an amorphous epitaxy mask, for example by a silicon oxide mask, on a surface. During the growth, the crystallization only takes place on the exposed surface of the single crystal semiconductor body. In so doing, single semiconductor crystal regions grow on the exposed surface of the semiconductor body, i.e. at selective locations of the semiconductor body defined by the amorphous epitaxy mask.

Typically, semiconductor body 40 is in an upper portion, which extends to the horizontal surface 15, of the first conductivity type (n-type) as illustrated by semiconductor region 1. Forming the epitaxial regions 2a, 3 typically includes forming an epitaxial region 2a of the first conductivity type on the semiconductor body 40 and an epitaxial region 3 of a second conductivity type (p-type) on the epitaxial region 2a of the first conductivity type. In so doing a horizontally extending pn-junction is formed in each of the epitaxial regions 2a, 3.

Figure 7:
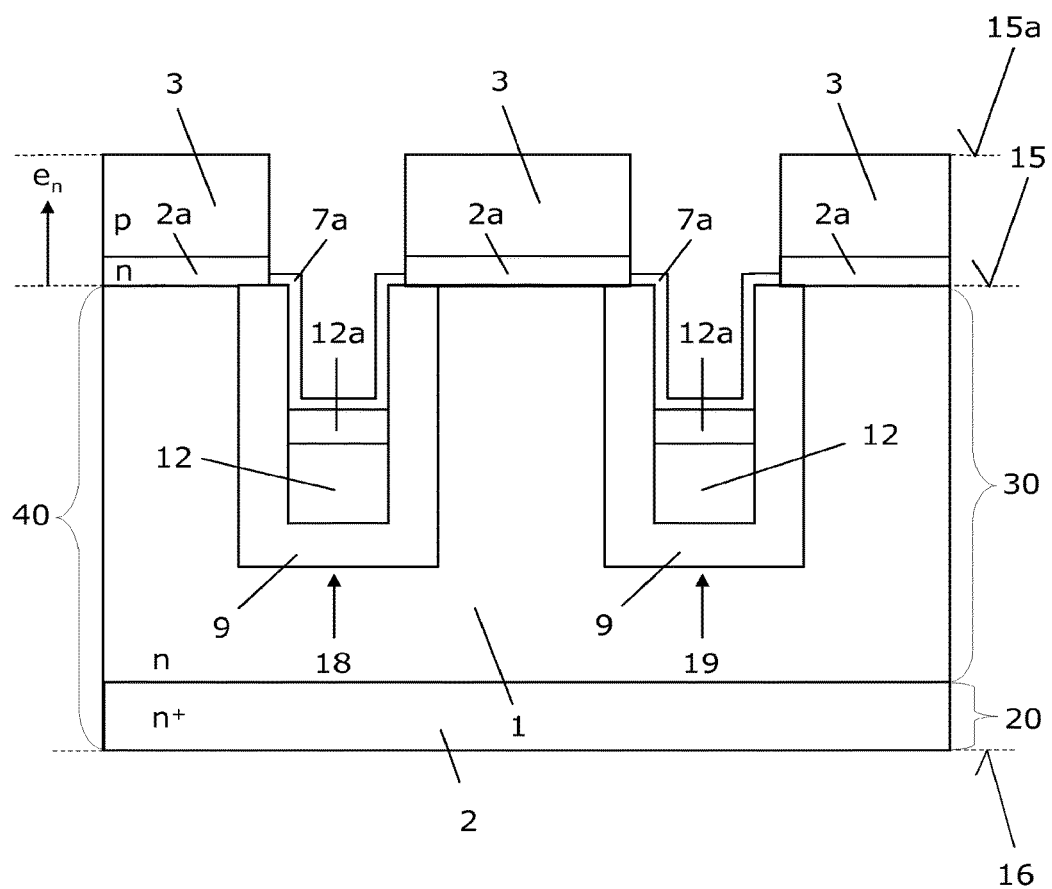

Thereafter, the epitaxy hard mask formed by the dielectric plugs 14a is removed selectively to the epitaxial regions 2, 3a to expose an upper portion of the sidewalls of the epitaxial regions 2a, 3. The resulting semiconductor device 100 is illustrated in FIG. 7.

Figure 8:
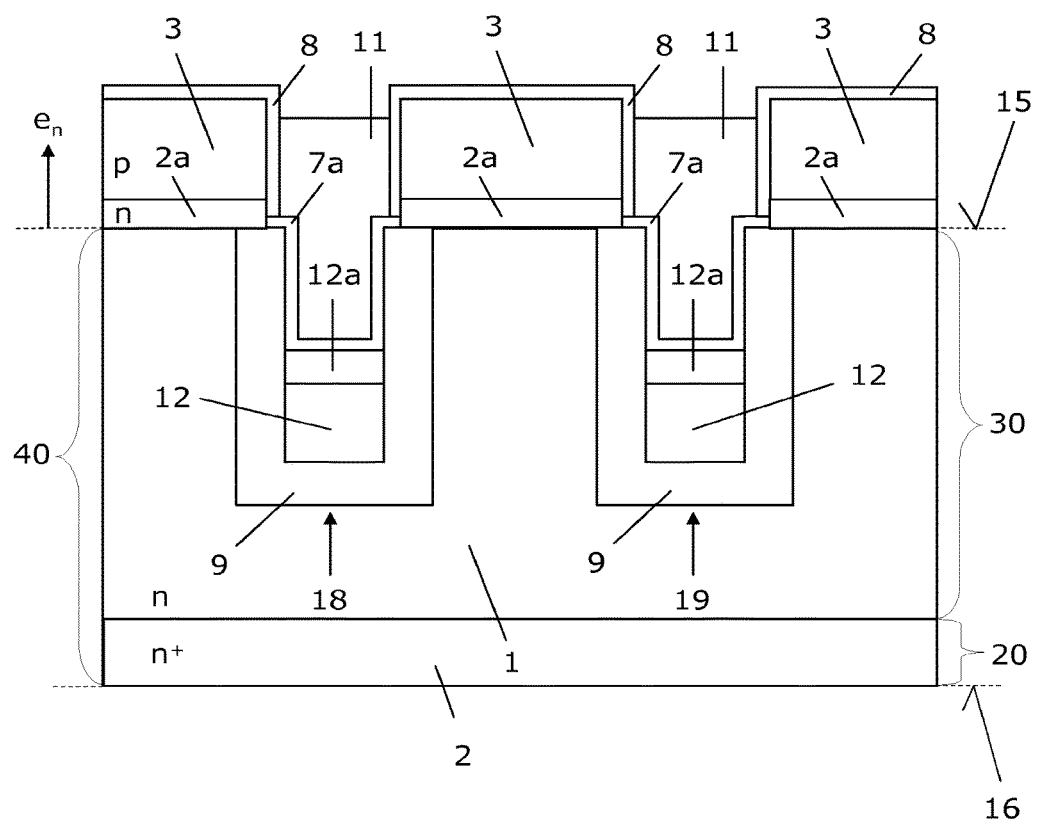

Thereafter, an insulated gate electrode 11 is formed above the insulated field plate 12 in each of the vertical trenches 18, 19. Forming the insulated gate electrodes 11 typically includes forming a thin gate dielectric region 8 at the exposed side walls of the epitaxial regions 2a, 3, for example by thermal oxidation. This is typically followed by depositing and partially back-etching a conductive material such as a highly doped poly-Si to form gate electrodes 11. The resulting semiconductor device 100 is illustrated in FIG. 8.

Thereafter, an insulating plug 6 is formed on each of the gate electrodes 11, for example by thermal oxidation.

Typically, the first semiconductor region 1 and the epitaxial regions 2a form a drift region, and the epitaxial regions 3 form body regions of the semiconductor device 100.

Figure 9:
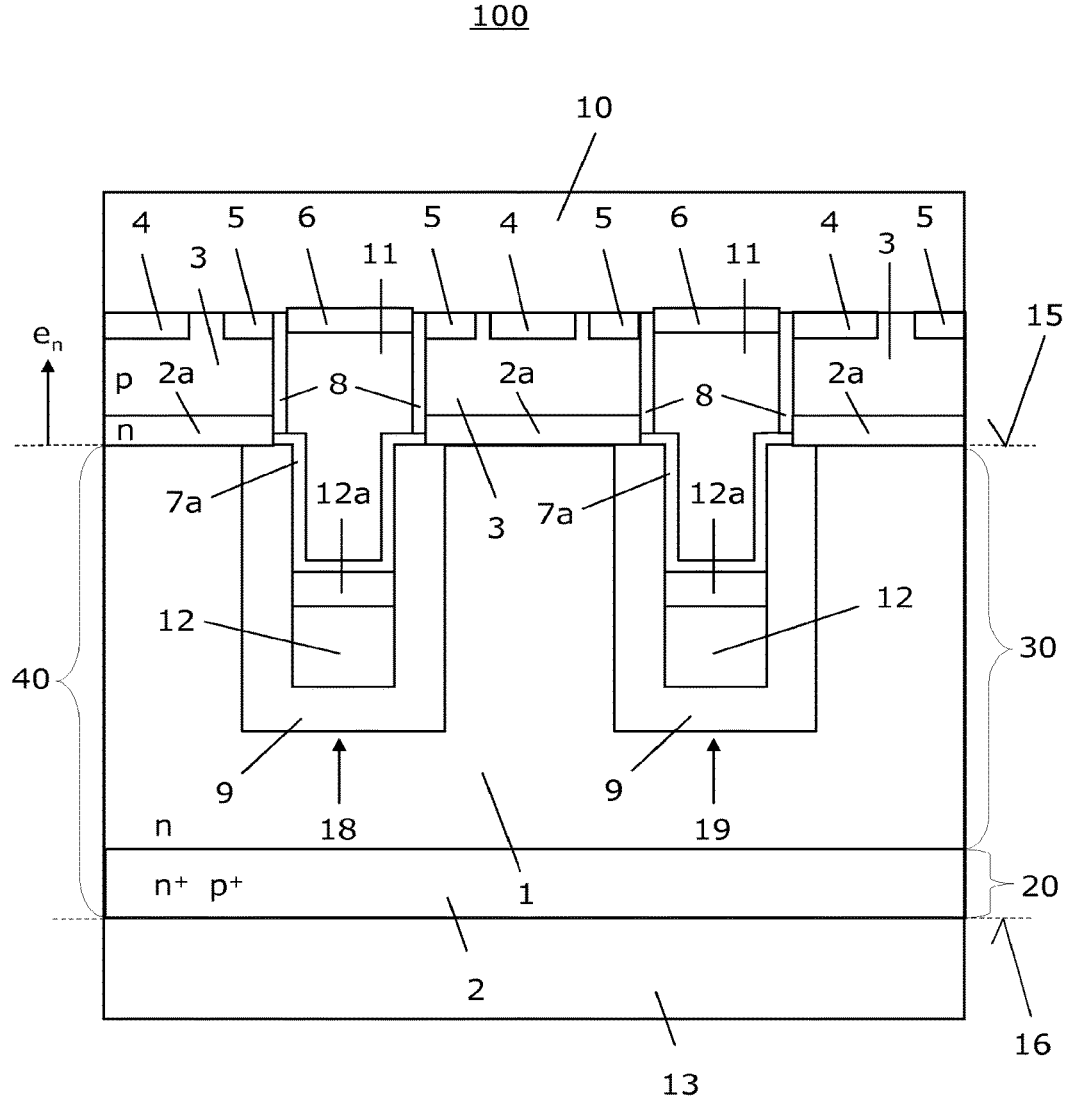

Highly doped body contact regions 4 of the second conductivity type and highly doped source regions 5 of the first conductivity type are formed in the body regions 3, e.g. by implantation. A first electrode 10 in ohmic contact with the body contact regions 4 and the source regions 5 is formed on the body regions 3. A second electrode 13 in ohmic contact with the second semiconductor region 2 is formed on the back surface 16. The resulting semiconductor device 100 is illustrated in FIG. 9. Depending on doping type of the second semiconductor region 2, semiconductor device 100 may form a MOSFET for an n-type second semiconductor region 2 or an IGBT for a p-type second semiconductor region 2.

In the exemplary embodiment illustrated in FIG. 9, the first electrode 10 forms surface contacts to the body contact regions 4 and the source regions 5. These contacts may, however, also be formed as shallow trench contacts.

Due to forming the epitaxial regions 2a, 3a and the vertical trenches 18, 19 for the field plates 12 self-aligned to each other by using a trench hard mask and an epitaxy hard mask as described above, the geometry of the body region 3 and the arrangement of the field oxide 9 relative to the body regions 3 may be adjusted with high precision. The epitaxy regions 2a, 3 grow from horizontal surface 15, and the vertical trenches 18, 19 are formed from horizontal surface 15 into the semiconductor body 40. In so doing, horizontal surface 15 determines the field plate transition point, i.e the vertical height up to which the field oxide 9 extends, with a precision of below a few nm. Furthermore, the vertical extension of the epitaxial regions 2a and 3 may be adjusted with an accuracy of 5 nm or even below. The variation of the Miller capacitance between the gate electrodes 11 and the drift region 2a, 1 can thus be kept small. This allows optimizing the design of the semiconductor device 100 such that the Miller capacitance is reduced without unfavorable variation for different gate electrodes 11. Accordingly, switching losses of semiconductor device 100 may be reduced. Furthermore, the vertical extension of the body regions 3 may be chosen comparatively small, for example between about 150 nm and 250 nm. This is due to low height variation of body regions 3 which is due to using the epitaxy hard mask as a CMP-stop. Accordingly, the length of the channel region, which may be formed during device operation between source region 5 and drift region 2a in each body region 3 along the respective gate dielectric region 8, may be chosen comparatively small and with a low variation of a few nm only. Thus, on-state losses of semiconductor device 100 may significantly by reduced.

Figure 10:
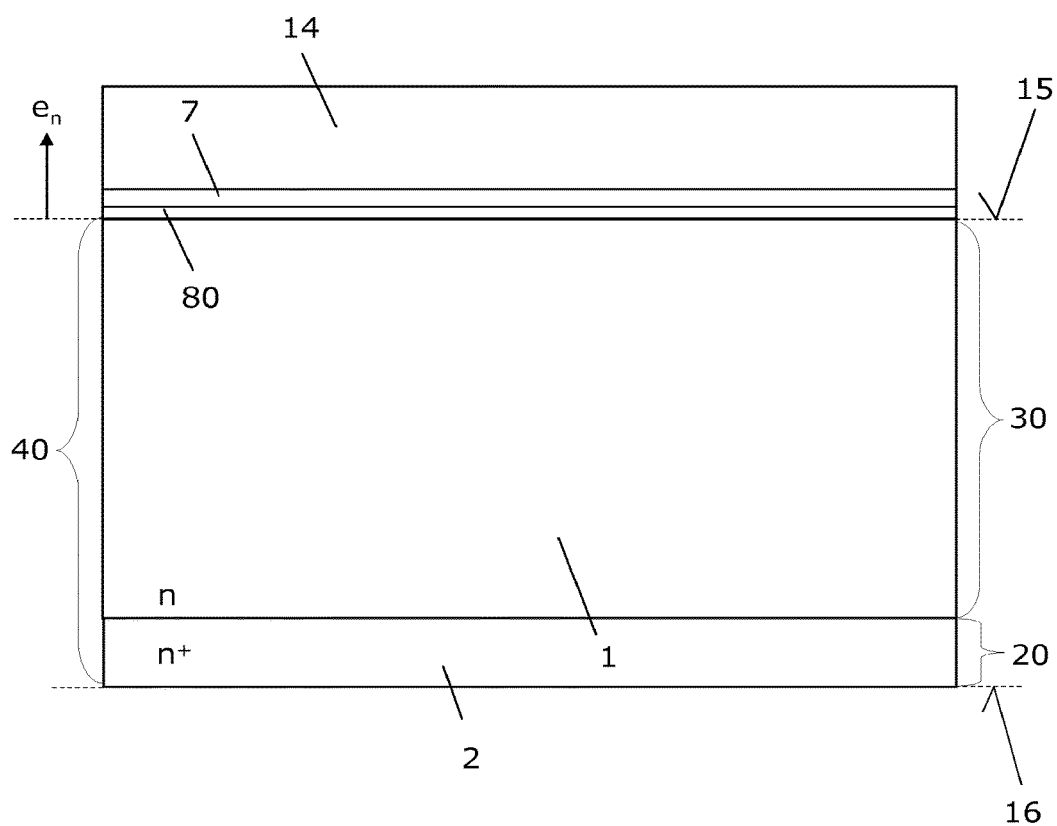
FIGS. 10 to 23 schematically illustrate, in vertical cross-sections, manufacturing processes according to one or more embodiments.

FIGS. 10 to 23 illustrate a method for forming a semiconductor device 200 according to several embodiments in vertical cross-sections. In a first process, a wafer or substrate 40 having a horizontal surface 15 and a first semiconductor layer 1 of the first conductivity type (n-type) is provided. The semiconductor layer 1 extends to the horizontal surface 15. The normal direction $e_n$ of the first surface 15 is substantially parallel to the vertical direction. A trench hard mask layer 80, 7, 14 is arranged on the horizontal surface. The resulting semiconductor device 200 is illustrated in FIG. 10.

The trench hard mask layer 80, 7, 14 typically includes a stack of dielectric layers. A thin oxide layer 80, for example a 10 nm thermal oxide layer is arranged on the horizontal surface 15. A nitride layer 7 typically about 10 nm thick is arranged on the thin oxide layer 7. Thereon a TEOS-layer 14 or USG-layer 14 is formed. The vertical thickness of the TEOS-layer 14 or USG-layer 14 is typically about 400 nm, but may also be chosen in a range from about 300 nm to about 600 nm.

Figure 11:
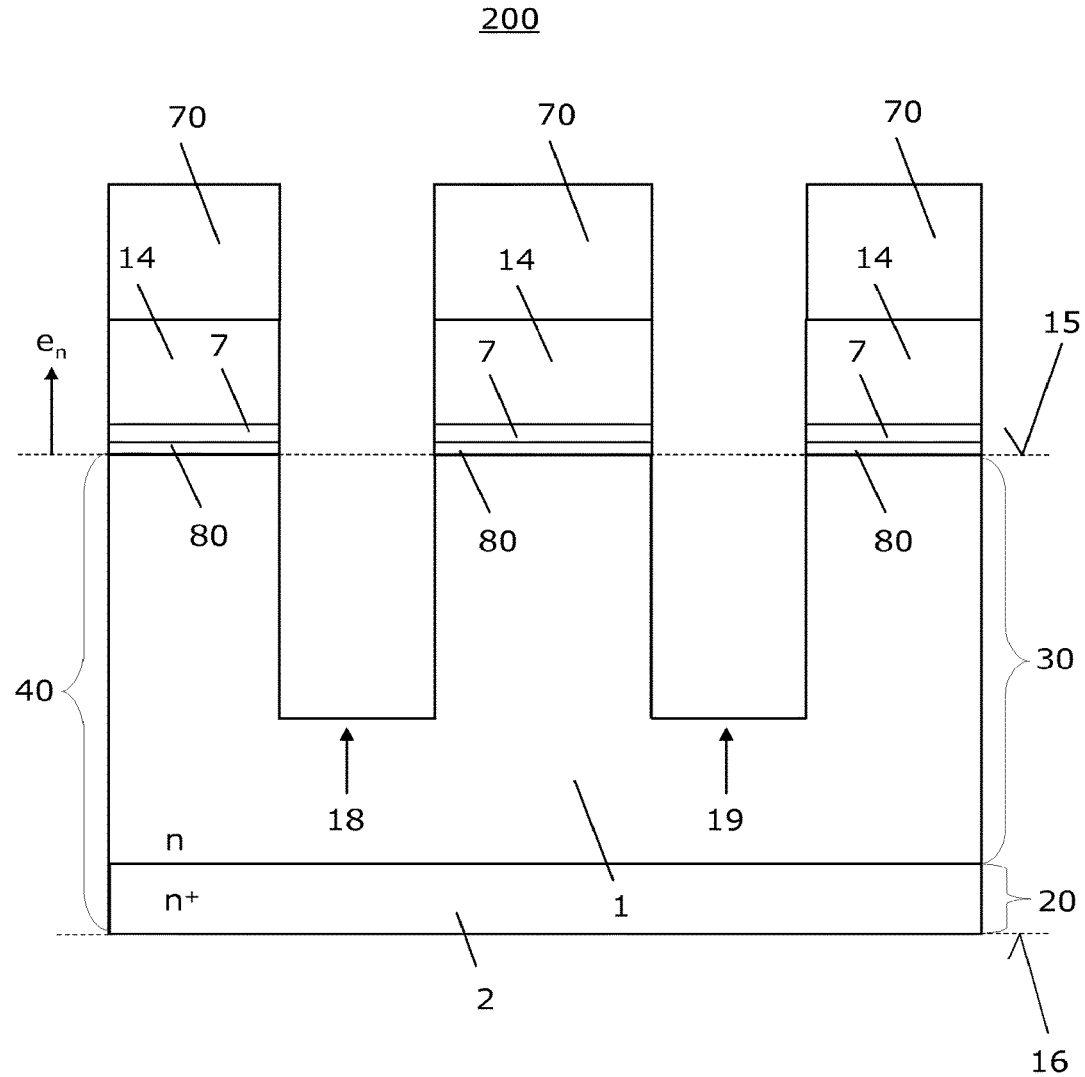

Thereafter, a photolithographically structured mask 70 is formed on the trench hard mask layer 80, 7, 14. Vertical trenches 18, 19 are formed in the trench hard mask layer 80, 7, 14 and the semiconductor body 40 using the photolithographically structured mask 70 as an etching mask. The resulting semiconductor device 200 is illustrated in FIG. 11.

Figure 12:
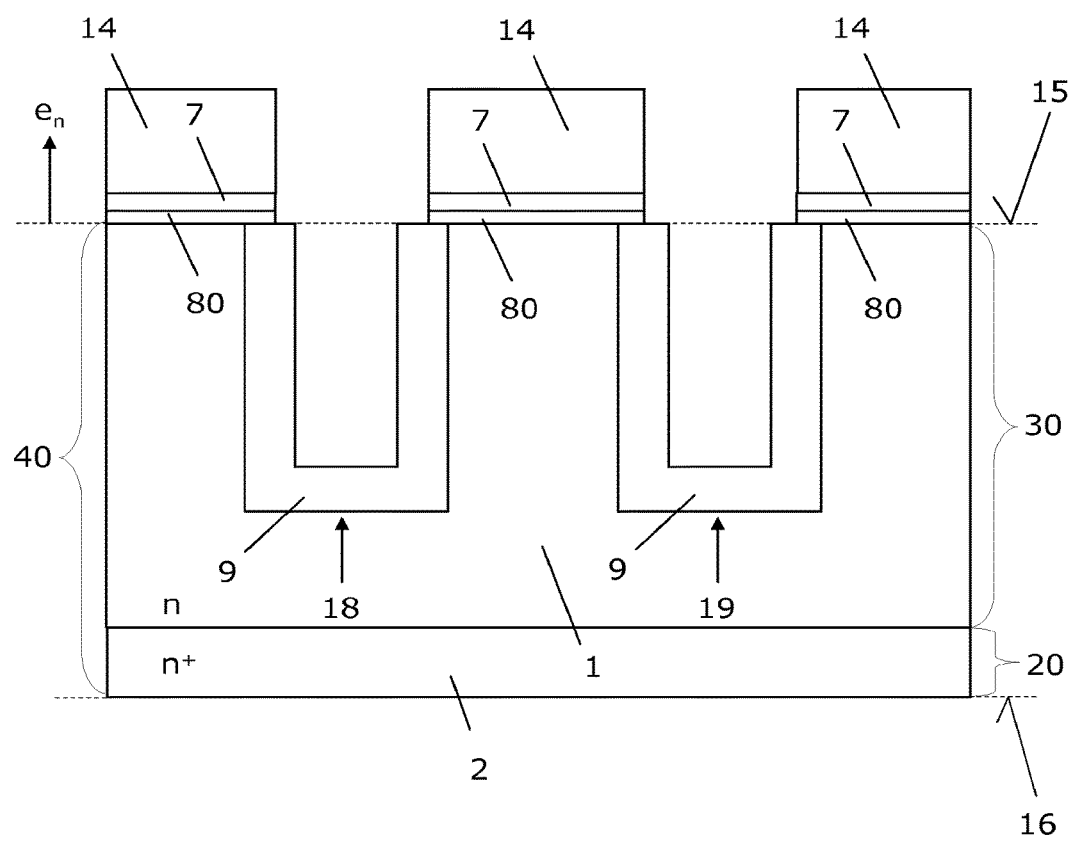

Thereafter, a field oxide 9 is formed on the side walls and the bottom walls of the vertical trenches 18, 19. The field oxide 9 is typically formed by thermal oxidation. The resulting semiconductor device 200 is illustrated in FIG. 12.

Figure 13:
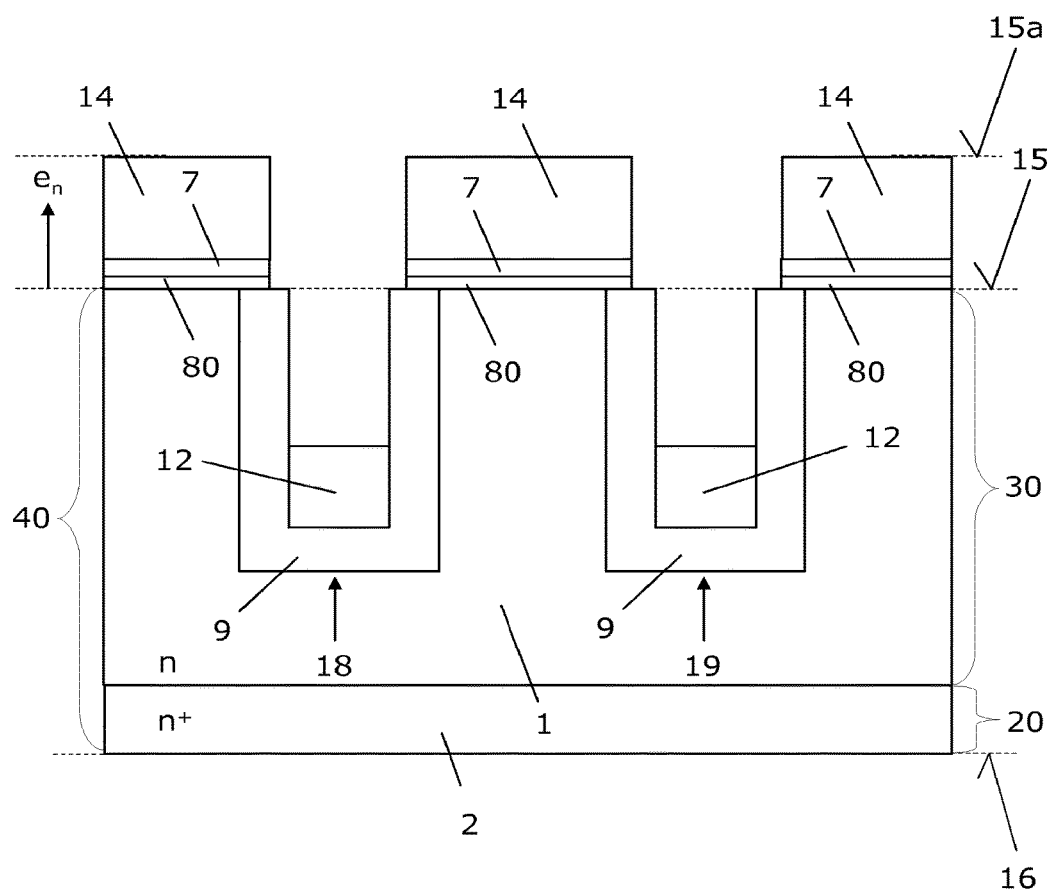

Thereafter, a field plate 12 is formed in a lower portion of each of the vertical trenches 18, 19. The resulting semiconductor device 200 is illustrated in FIG. 13. The field plates 12 are typically formed by depositing a conductive material such as highly doped poly-silicon and back-etching of the deposited conductive material.

Thereafter, an insulating region 12a is formed on each of the field plates 12, for example by thermal oxidation of an upper portion of the back-etched conductive material. In so doing, an insulated field plate is formed in each of the vertical trenches 18, 19.

Figure 14:
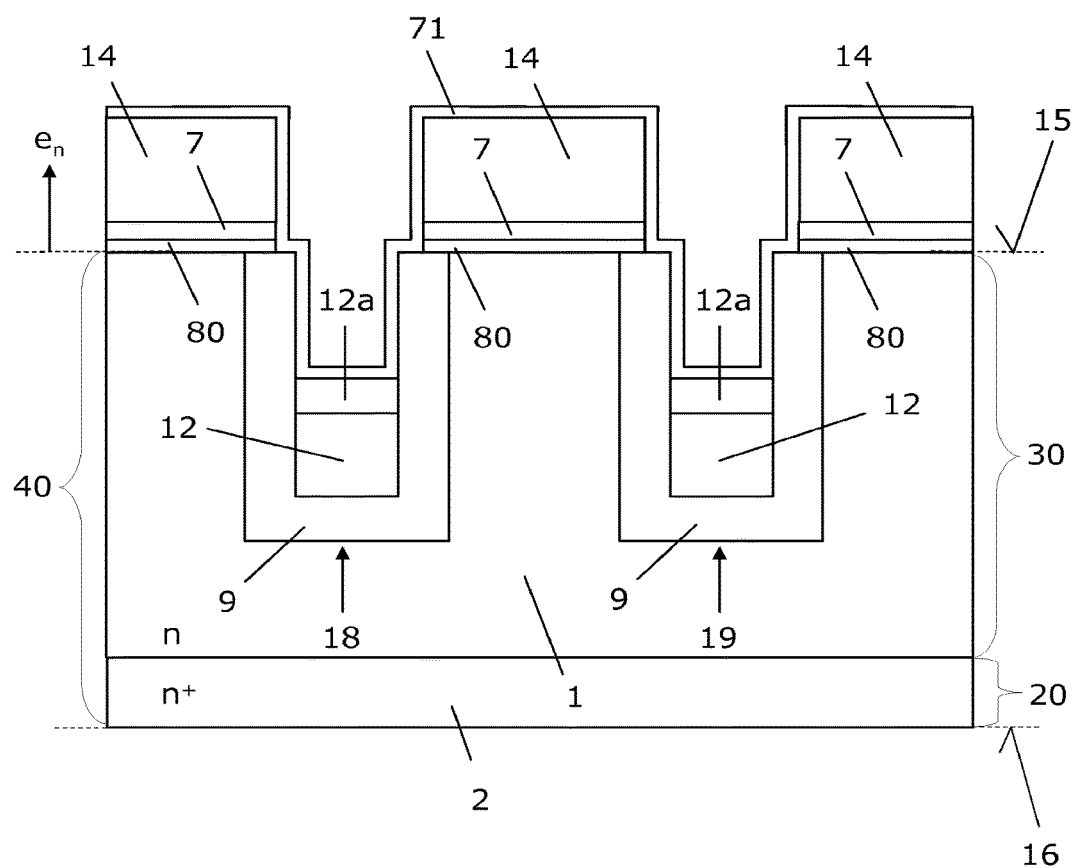

Thereafter, a liner layer 71 is deposited on the trench hard mask 80, 7, 14 as a conformal layer. The resulting semiconductor structure 200 is illustrated in FIG. 14.

Typically, the liner layer 71 has a thickness of about 20 nm to about 40 nm, for example a thickness of about 30 nm. In the exemplary embodiment illustrated in FIG. 14, the liner layer 71 is formed as an amorphous silicon layer. The liner layer 71 covers at least the trench hard mask 7, 14, 80 and an upper portion of the field oxide 9.

Figure 15:
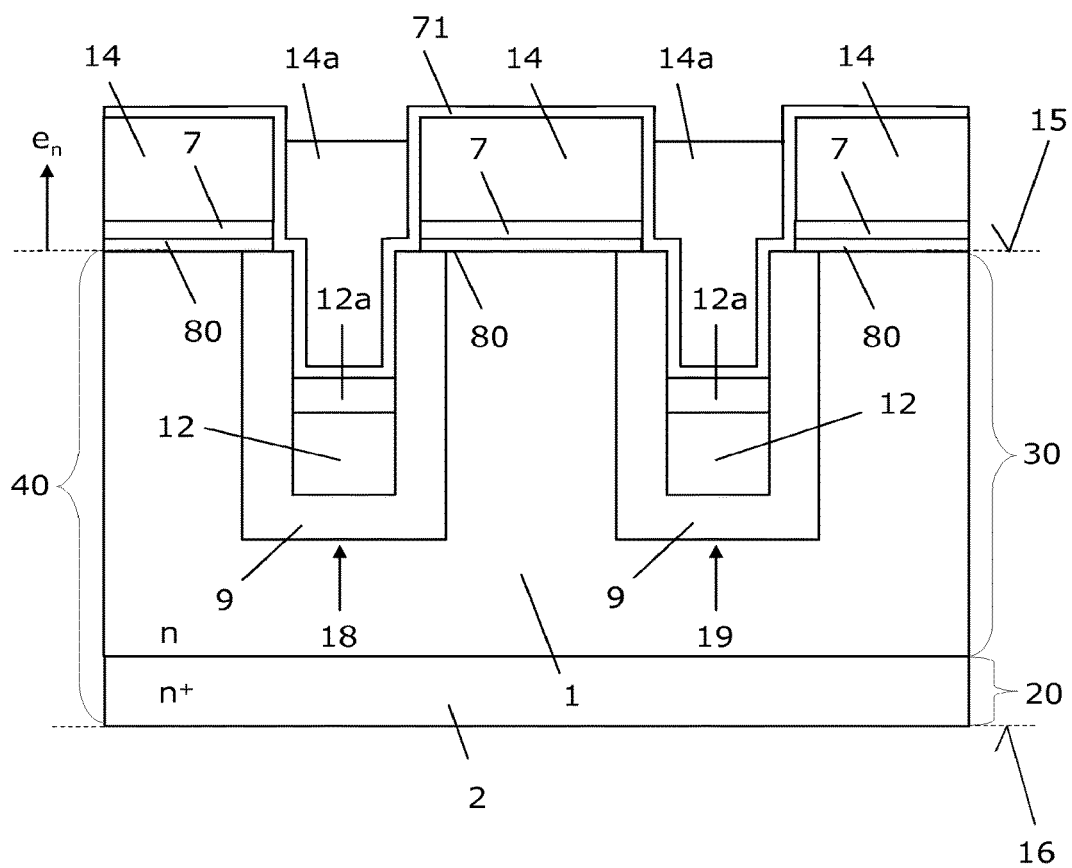

Thereafter, a dielectric plug 14a is formed in an upper portion of each of the vertical trenches 18, 19 so that the dielectric plugs 14a extend beyond the horizontal surface 15 of the semiconductor body 40. Forming the dielectric plugs 14a typically includes depositing a dielectric material, for example a TEOS, and a recess process using for example a resist etch tool or an oxide etch tool. The resulting semiconductor structure 200 is illustrated in FIG. 15.

Figure 16:
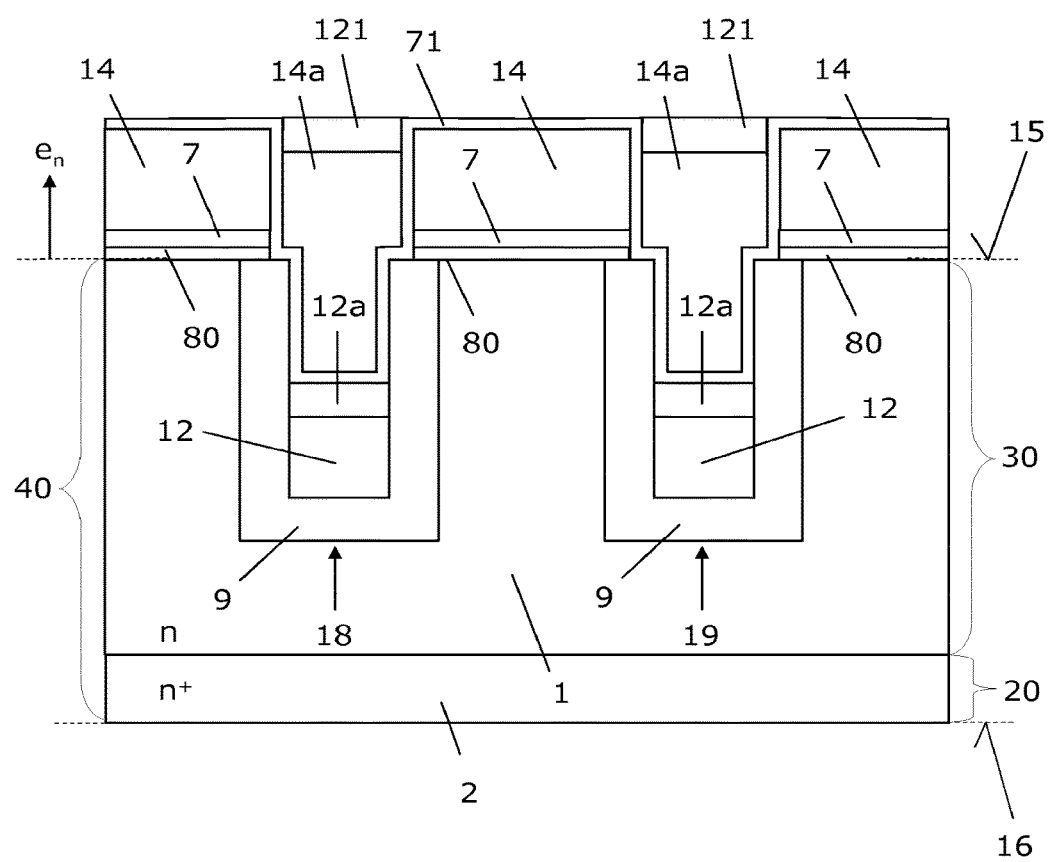

Thereafter, a poly-silicon material 121 is typically deposited. The resulting semiconductor structure 200 is illustrated in FIG. 16.

Figure 17:
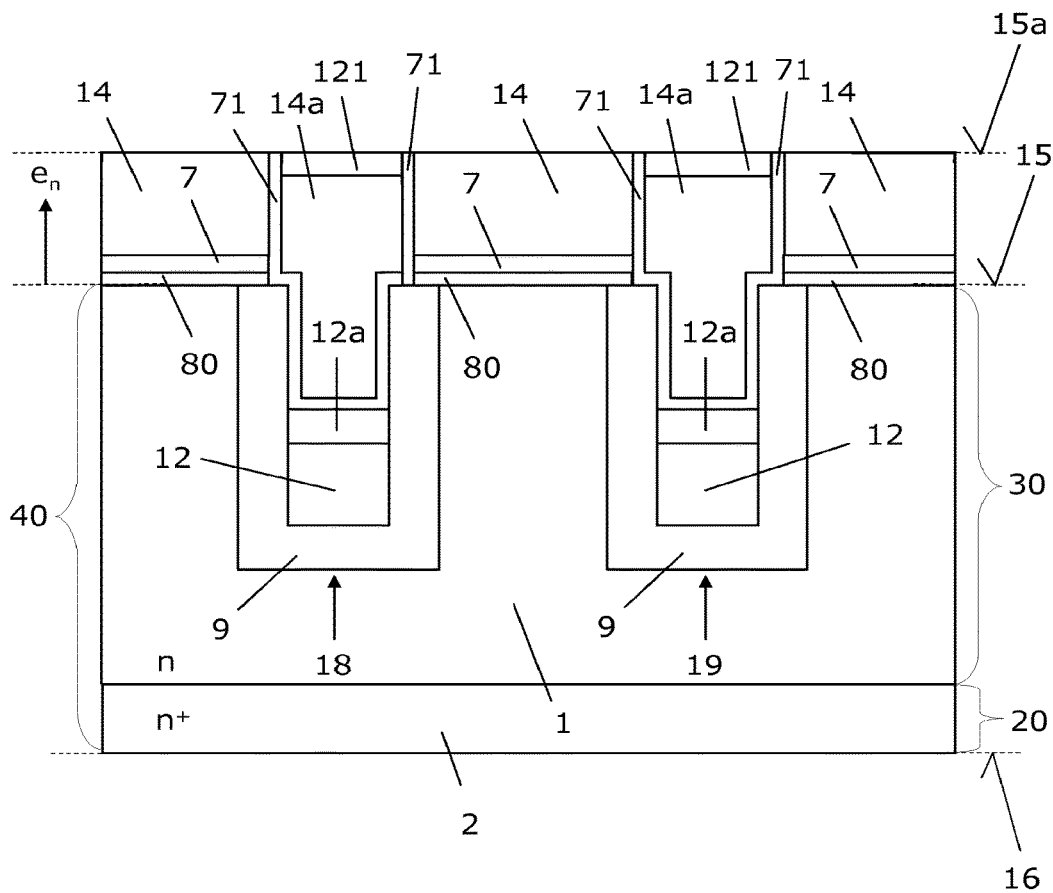

In a CMP-process, the poly-silicon material 121 is polished back to the trench hard mask 7, 14, 80. The resulting semiconductor structure 200 is illustrated in FIG. 17.

Figure 18:
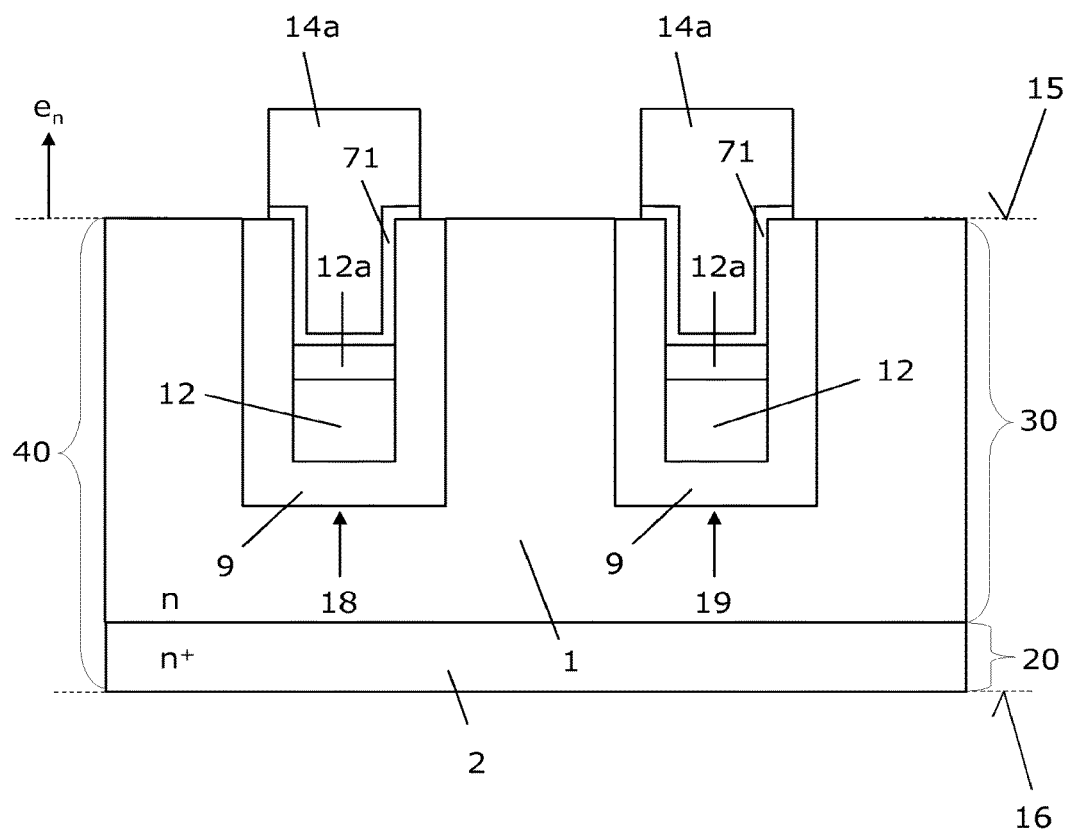

Thereafter, an upper portion 14 of the trench hard mask 7, 14, 80 is removed selectively to the liner layer 71 to partly expose the semiconductor body 40. Typically, the TEOS-layer 14 or USG-layer 14 is removed by an oxide etching. Thereafter, an isotropic silicon etching is used to remove the silicon material above the horizontal surface 15 of the semiconductor body 40. Thereafter, the nitride layer 7 may be removed by hot phosphoric acid and the thin oxide layer 80 may be removed using an HF-etching (Hydrofluoric Acid etching). The resulting semiconductor structure 200 is illustrated in FIG. 18. The semiconductor device 200 illustrated in FIG. 18 is similar to the semiconductor device 100 illustrated in FIG. 5. However, the remaining portions of the liner layer 7a are formed by poly-silicon in the semiconductor device 200.

Figure 19:
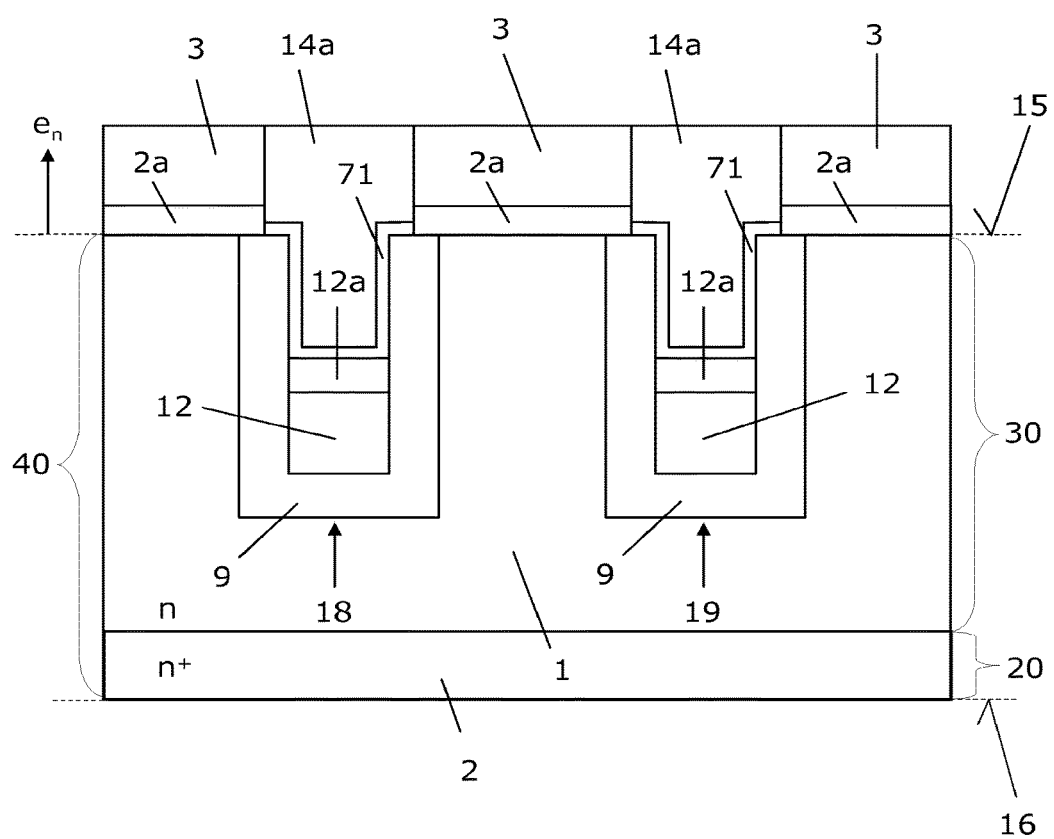

Thereafter, silicon is deposited on the exposed portions of the semiconductor body 40 by an epitaxial deposition which is selective to the epitaxy hard mask formed by the dielectric plugs 14a. This is done by selective epitaxy and a silicon-CMP process. Accordingly, the semiconductor material is polished back to the epitaxy hard mask 14a so that, in the illustrated vertical cross-section, at least two spaced apart epitaxial regions 2a, 3 are formed with a vertical extension which is substantially determined by the height of the dielectric plugs 14a measured from the horizontal surface 15. The resulting semiconductor structure 200 is illustrated in FIG. 19.

Forming the epitaxial regions 2a, 3 typically includes forming epitaxial regions 2a of the first conductivity type on the semiconductor body 40 and epitaxial regions 3 of a second conductivity type (p-type) on the epitaxial regions 2a of the first conductivity type. Accordingly, a horizontally extending pn-junction is formed between the epitaxial regions 2a and 3.

Figure 20:
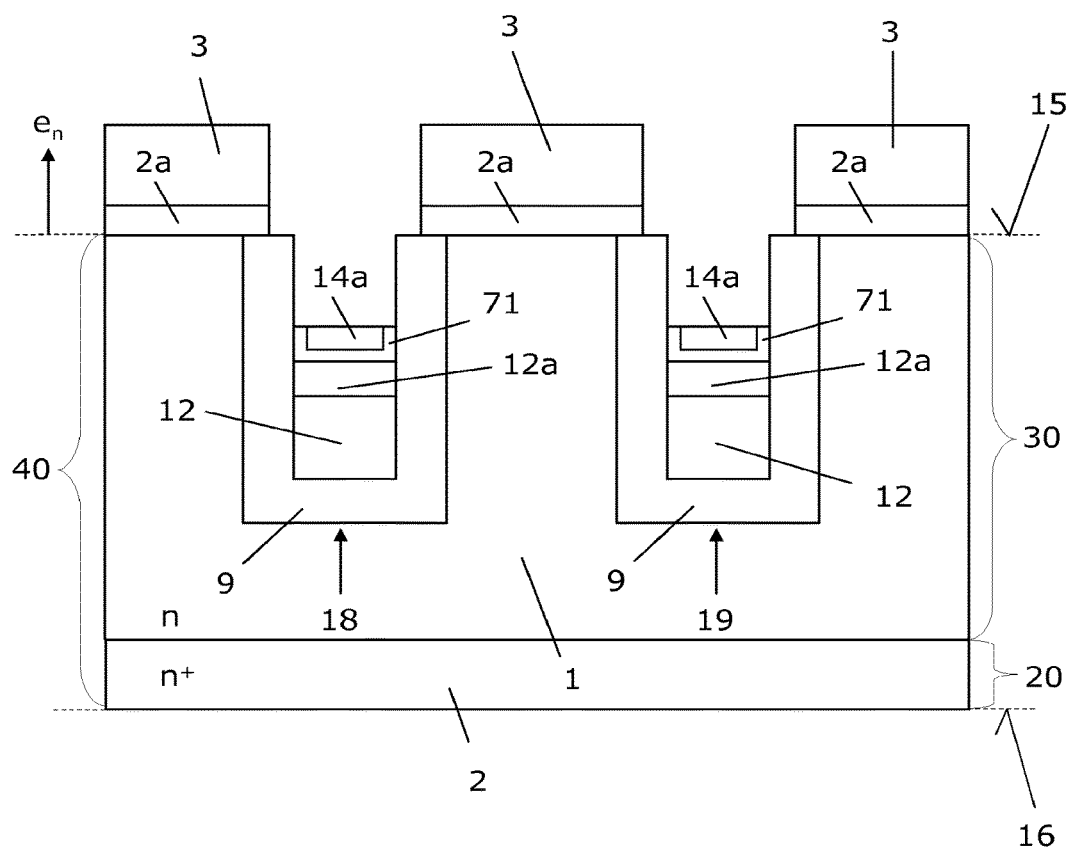
Figure 21:
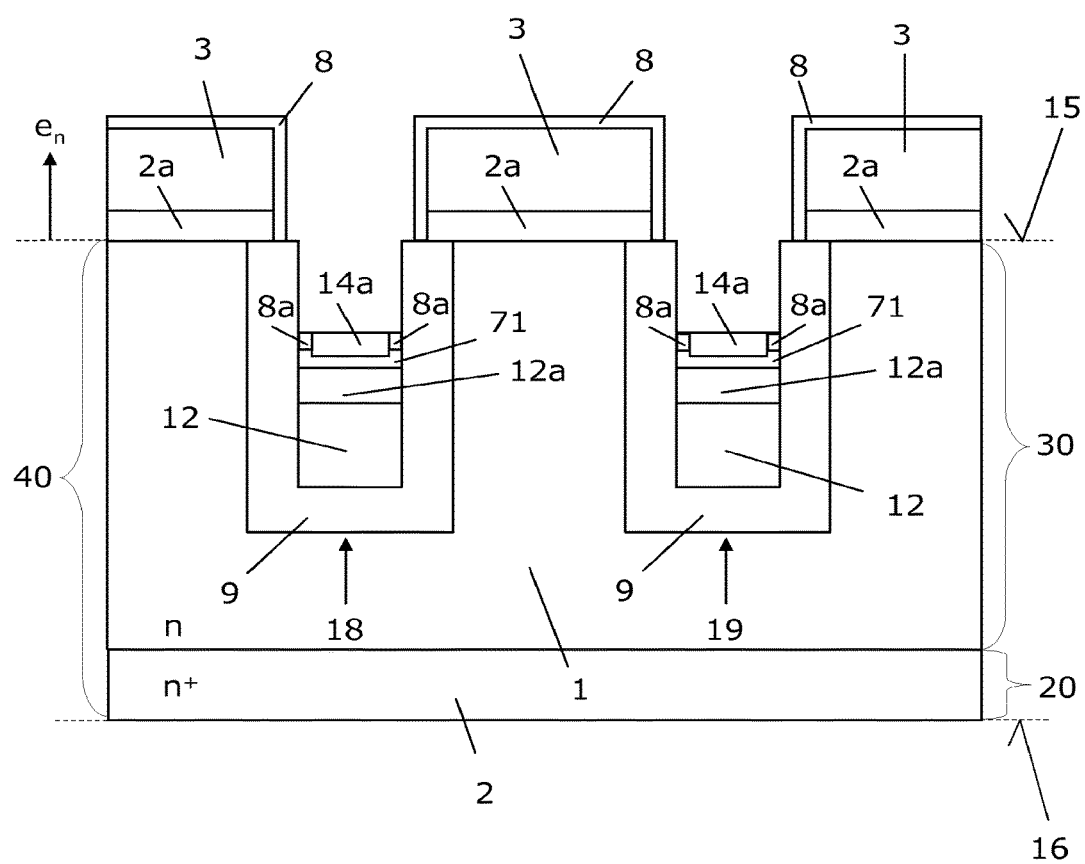

Thereafter, the dielectric plugs 14a are removed at least between the epitaxial regions 2a, 3, typically using an oxide etching process. A short isotropic silicon etching process is typically used to remove the liner layer 71 in an upper portion of the vertical trenches 18, 19 and to expose the side walls of the spaced apart epitaxial regions 2a, 3. The resulting semiconductor structure 200 is illustrated in FIG. 20.

Thereafter, a thin thermal oxide layer 8 is formed on the epitaxial regions 2a, 3. In so doing, the remaining portions of the liner layer 71 are also partly oxidized as indicated by the reference signs 8a in FIG. 21. The portions of the thin thermal oxide layer 8 which are formed on the side walls of the epitaxial regions 2a, 3 later typically form gate dielectric regions.

Figure 22:
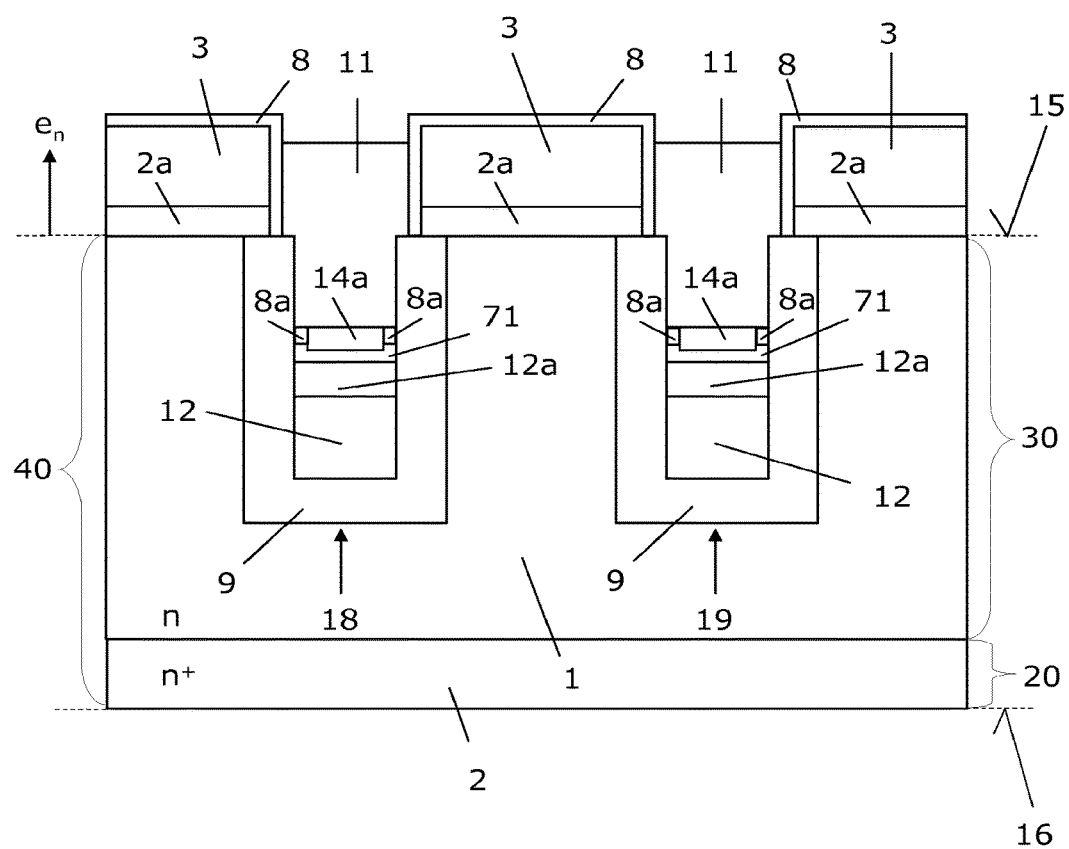

Thereafter, a conductive material such as a highly doped poly-Si is deposited and etched back to a form a gate electrode 11 in each of the trenches 18, 19. The resulting semiconductor device 200 is illustrated in FIG. 22.

Figure 23:
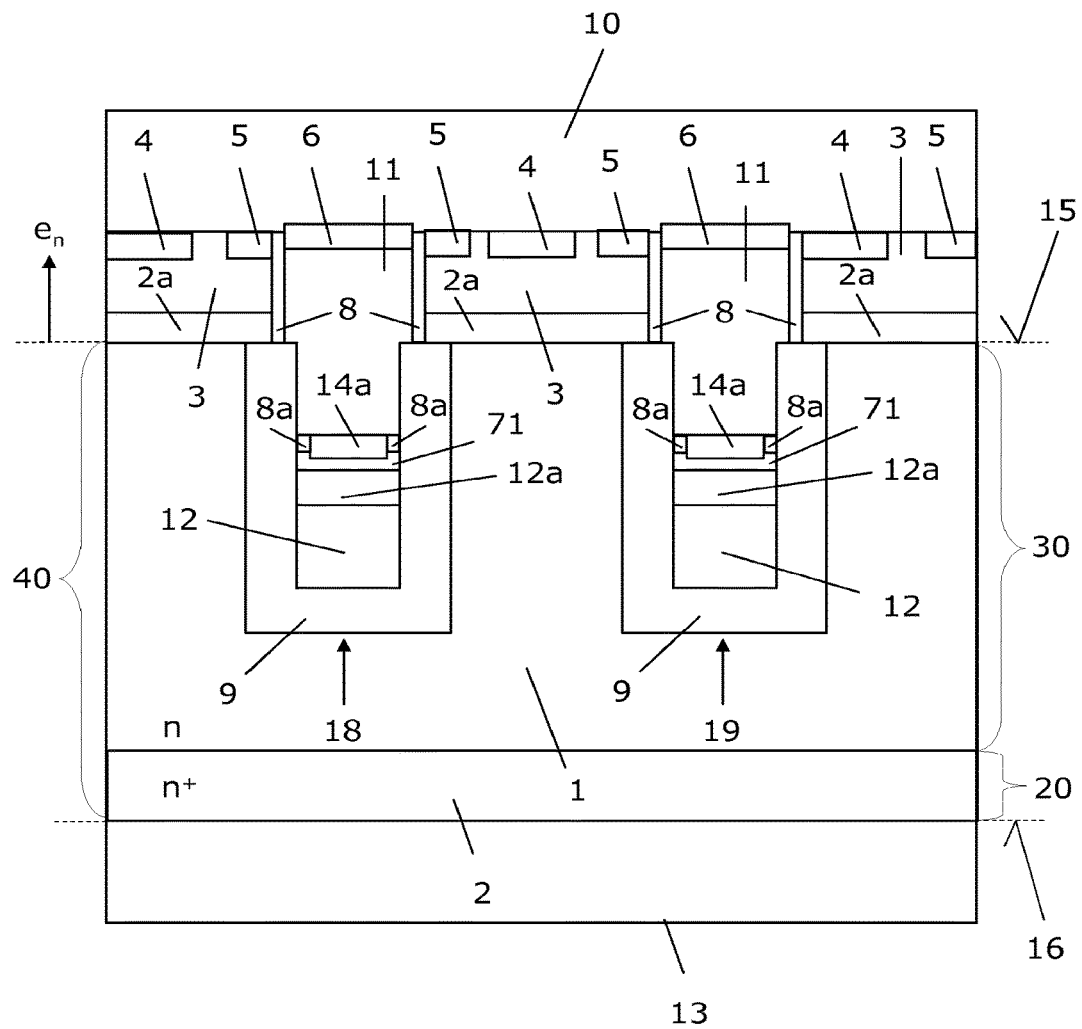

Thereafter, an insulating plug 6 is formed on each of the gate electrodes 11, for example by thermal oxidation. Typically, the first semiconductor region 1 and the epitaxial regions 2a form a drift region, and the epitaxial regions 3 form body regions of the semiconductor device 200. Highly doped body contact regions 4 of the second conductivity type and highly doped source regions 5 of the first conductivity type are formed in the body regions 3, e.g. by implantation. A first electrode 11 in ohmic contact with the body contact regions 4 and the source regions 5 is formed on the body regions 3. A second electrode 13 in ohmic contact with the second semiconductor region 2 is formed on the back surface 16. The resulting semiconductor device 200 is illustrated in FIG. 23. Depending on doping type of the second semiconductor region 2, the semiconductor device 200 may also form a MOSFET or an IGBT.

The semiconductor device 200 illustrated in FIG. 23 is similar to the semiconductor device 100 illustrated in FIG. 9. The processes for manufacturing the semiconductor devices 100, 200 have in common that the trench hard mask is formed prior to forming the epitaxy hard mask, the epitaxy hard mask is formed self-aligned to the trench hard mask, and the trench hard mask is removed selectively to the epitaxy hard mask prior to forming the epitaxial region. In so doing, variation of the Miller capacitance of different gate electrodes may be kept small. This improves device performance, in particular switching performance of power semiconductor devices having a plurality of trench gate structures in their active area. Furthermore, the length of the channel regions in the body regions may be chosen small as the vertical extensions of the epitaxial regions may be defined with low variation by the thickness of the epitaxy hard mask. Accordingly, the resistance in the on-state of the semiconductor devices 100, 200 may be reduced.

Figure 24:
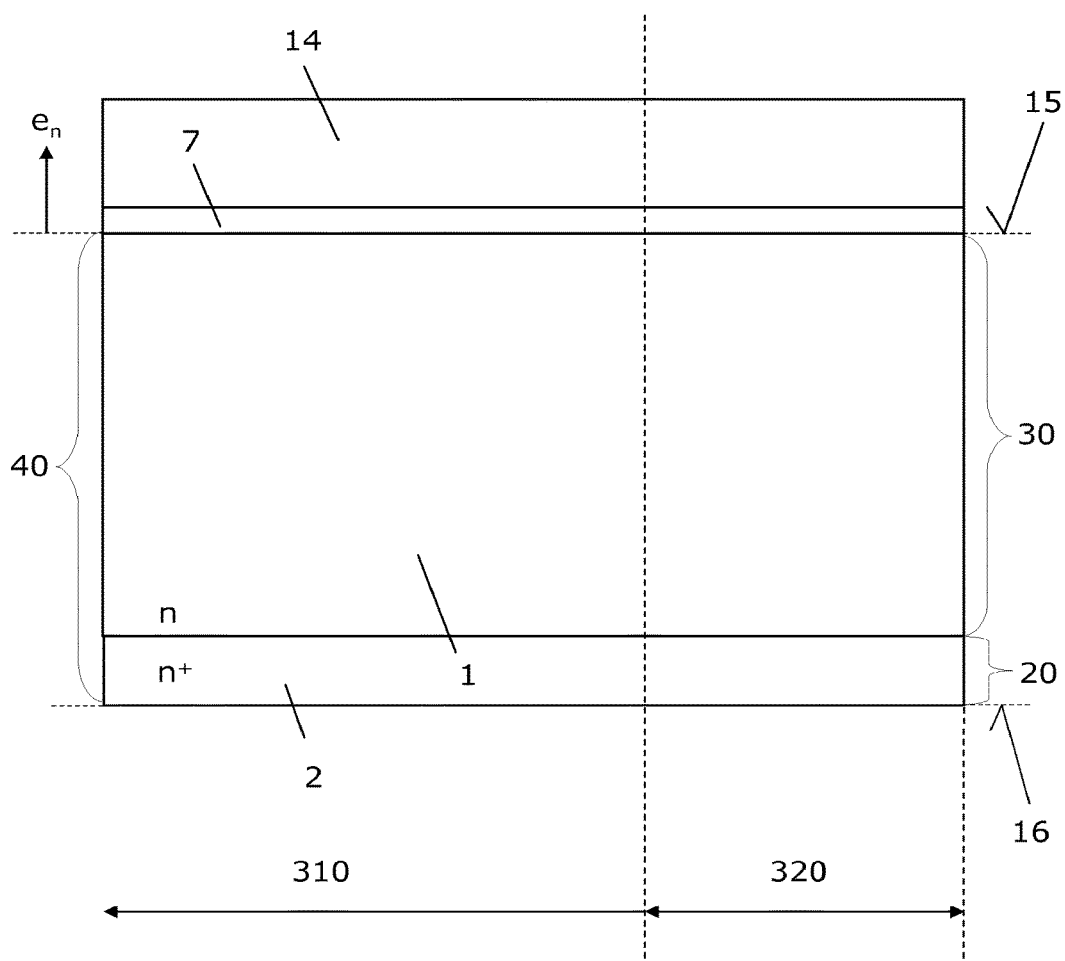
FIGS. 24 to 34 schematically illustrate, in vertical cross-sections, manufacturing processes according to one or more embodiments.

FIGS. 24 to 34 illustrate a method for forming a semiconductor device 300 according to several embodiments in vertical cross-sections. In a first process, a wafer or substrate 40 having a horizontal surface 15 and a first semiconductor layer 1 of the first conductivity type (n-type) is provided. Semiconductor layer 1 extends to the horizontal surface 15. The normal direction $e_n$ of the first surface 15 is substantially parallel to the vertical direction. A hard mask layer 7, 14 is arranged on the horizontal surface 15. The hard mask layer 7, 14 typically includes a silicon nitride layer 7 arranged on the horizontal surface 15 and a TEOS-layer 14 arranged on the silicon nitride layer 7. Instead of the TEOS-layer 14 an USG-layer may be arranged on the silicon nitride layer 7. The resulting semiconductor device 300 is illustrated in FIG. 24. The vertical extension of the silicon nitride layer 7 is typically chosen in a range from about 10 nm to about 50 nm. The vertical extension of the TEOS-layer 14 is typically chosen in a range from about 300 nm to about 600 nm.

The semiconductor device 300 is typically a power semiconductor device having an active area 310 for carrying and/or switching a load current and a peripheral area 320 with appropriate field redistributing structures to maximize the blocking capability of semiconductor device 300.

Figure 25:
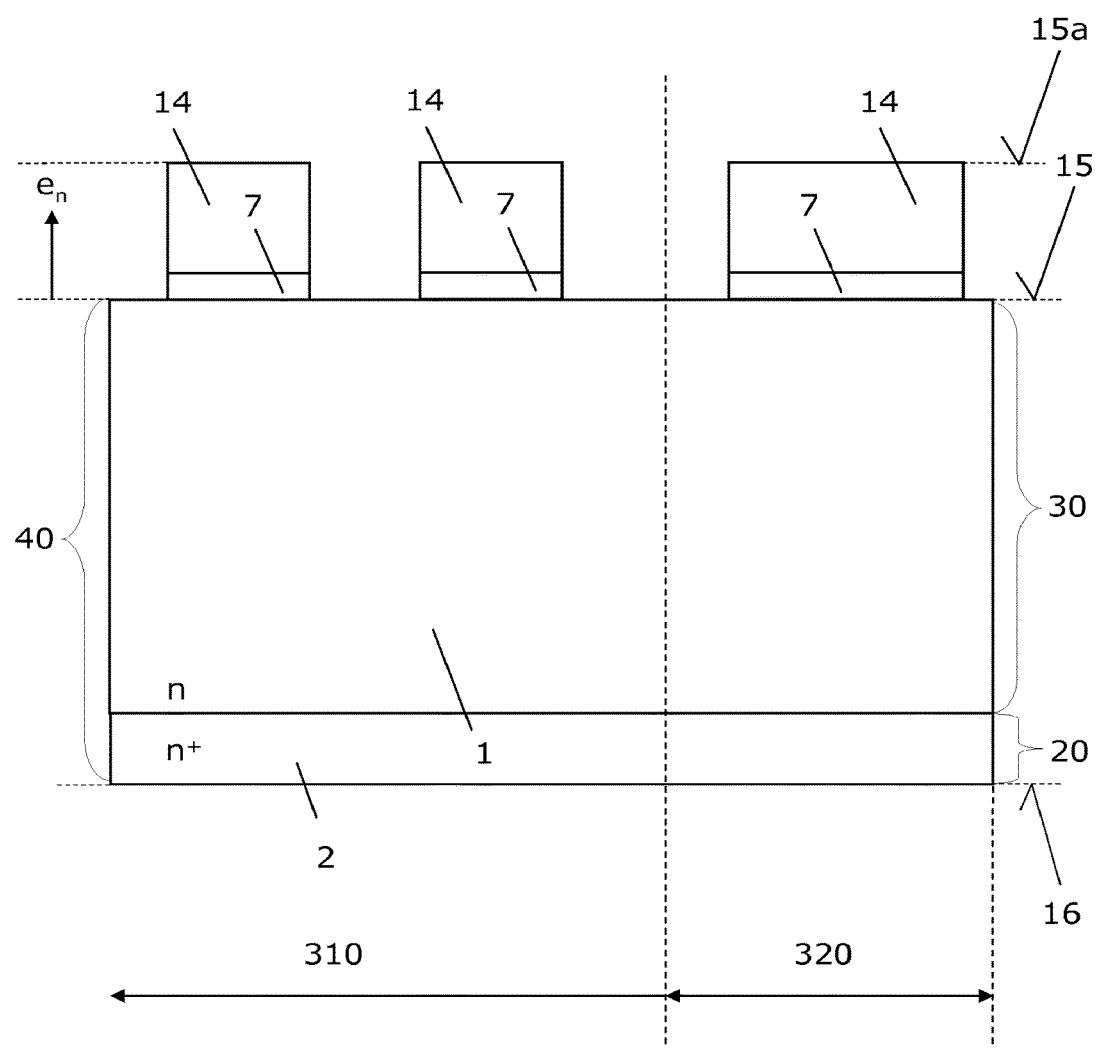

Thereafter, the hard mask layer 7, 14 is structured using a photolithographically structured mask as an etching mask. Accordingly, an epitaxy hard mask 7, 14, which extends from the horizontal surface 15 of the semiconductor body 40 to a further horizontal surface 15a, is formed. The resulting semiconductor device 300 is illustrated in FIG. 25 after removing the photolithographically structured mask.

Figure 26:
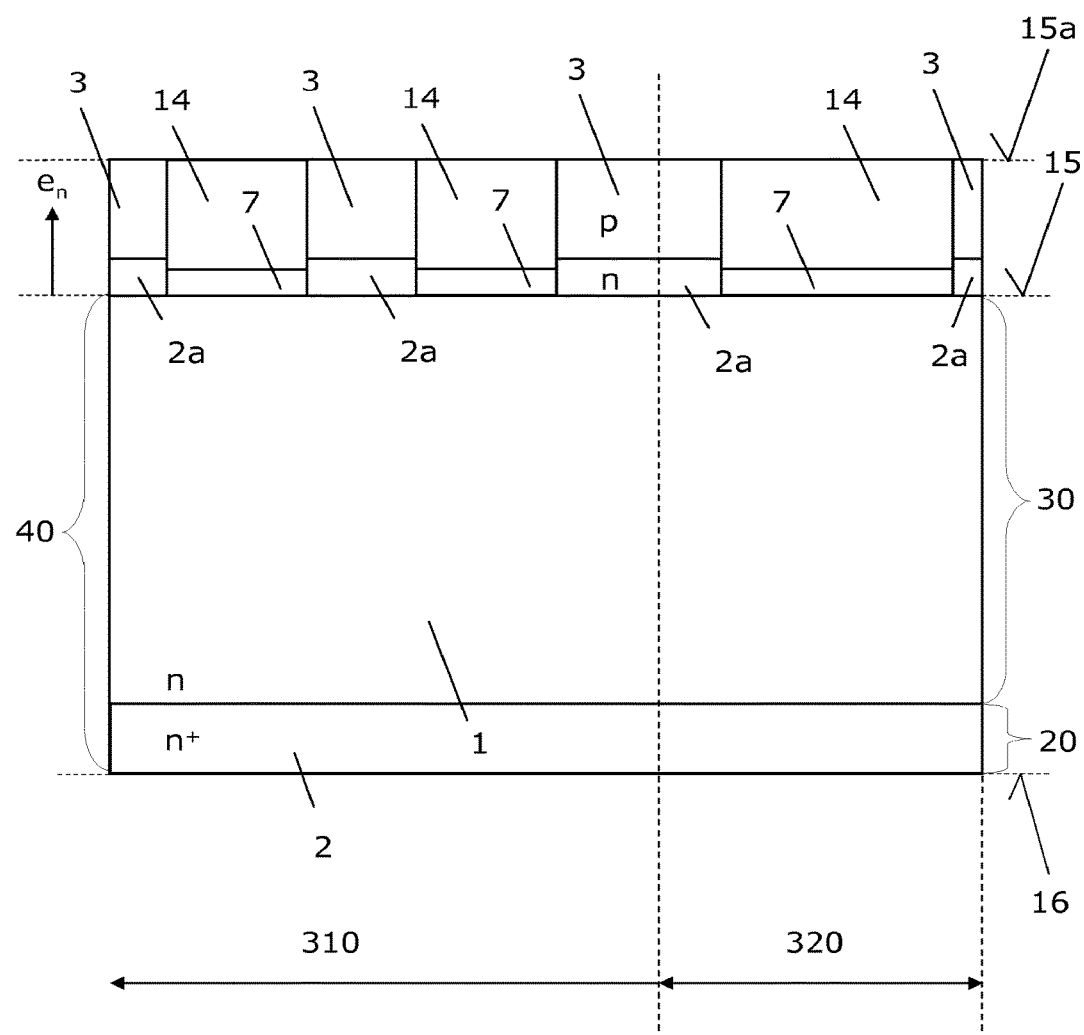

Thereafter, mono-crystalline silicon is deposited on the semiconductor body 40 by epitaxial deposition selective to the epitaxy hard mask 7, 14 by selective epitaxy. The deposited mono-crystalline silicon is polished back to the epitaxy hard mask 7, 14 so that, in the illustrated vertical cross-section, several spaced apart epitaxial regions 2a, 3 are formed. In so doing, the height of the epitaxial regions 2a, 3 is defined by the height of the epitaxy hard mask 7, 14. The resulting semiconductor device 300 is illustrated in FIG. 26.

Forming the epitaxial regions 2a, 3 typically includes forming epitaxial regions 2a of the first conductivity type on the semiconductor body 40 and epitaxial regions 3 of a second conductivity type (p-type) on the epitaxial regions 2a of the first conductivity type. Accordingly, a horizontally extending pn-junction is formed between the epitaxial regions 2a, 3.

Thereafter, the epitaxy hard mask 7, 14 is partly removed selectively to the epitaxial regions 2a, 3 so that, in the vertical cross-section, the sidewalls of the epitaxial regions 2a, 3 are exposed at least in an upper portion adjoining the p-type semiconductor region 3 which later forms body regions. This is typically done by completely removing the TEOS-layer 14 in an etching process.

Figure 27:
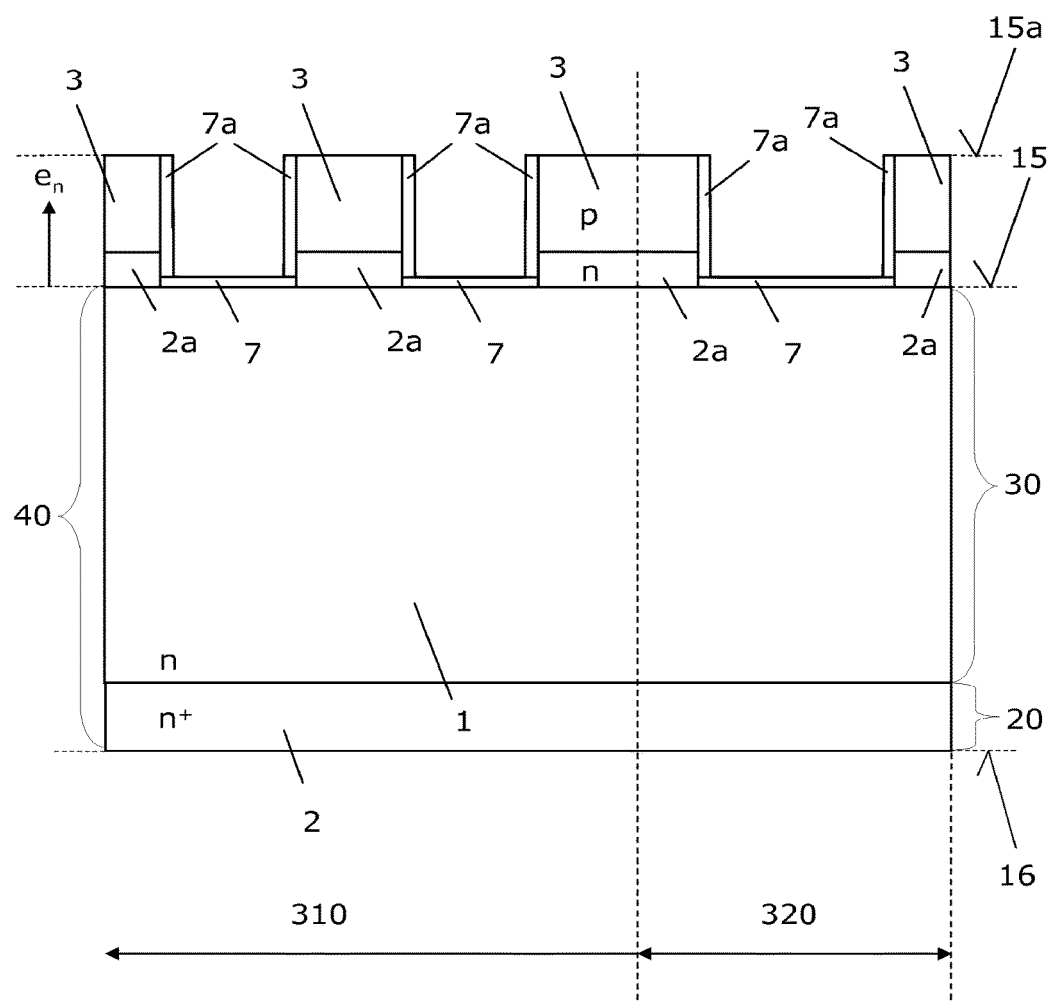

Thereafter, a thin silicon nitride layer 7a is conformly deposited and anisotropically etched. In so doing, the side walls of the epitaxial regions 2a, 3 are covered with the nitride layer 7a and the semiconductor body 40 between neighbouring spaced apart epitaxial regions 2a, 3 is typically covered with a remaining portion of the silicon nitride layer 7. The anisotropic silicone nitride etching is typically carried out such, that the silicon nitride above the epitaxial regions 3 is completely removed. The resulting semiconductor device 300 is illustrated in FIG. 27.

Figure 28:
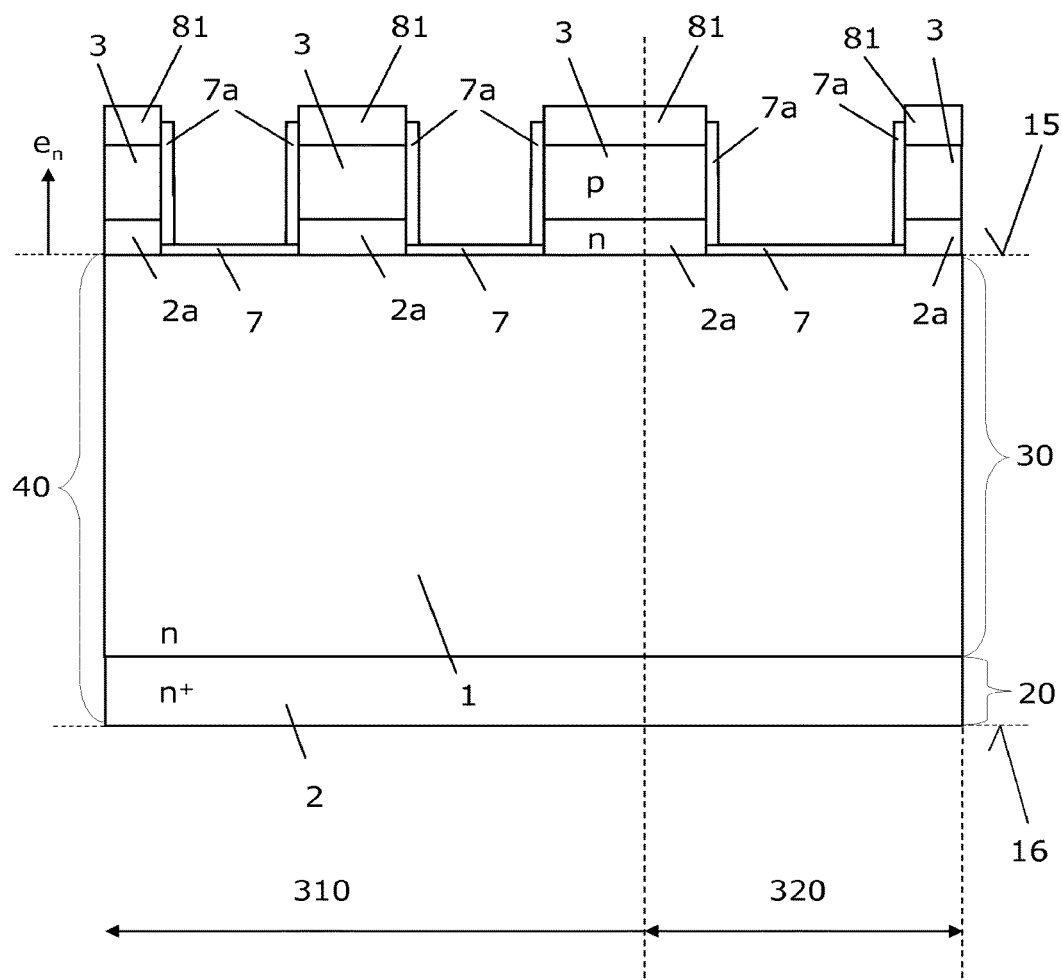

Thereafter a thermal oxide 81 is formed on the epitaxial regions 3. The thermal oxide 81 may be formed at a temperature of about 900° C. so that its the vertical extension is about 100 nm. The resulting semiconductor device 300 is illustrated in FIG. 28.

Figure 29:
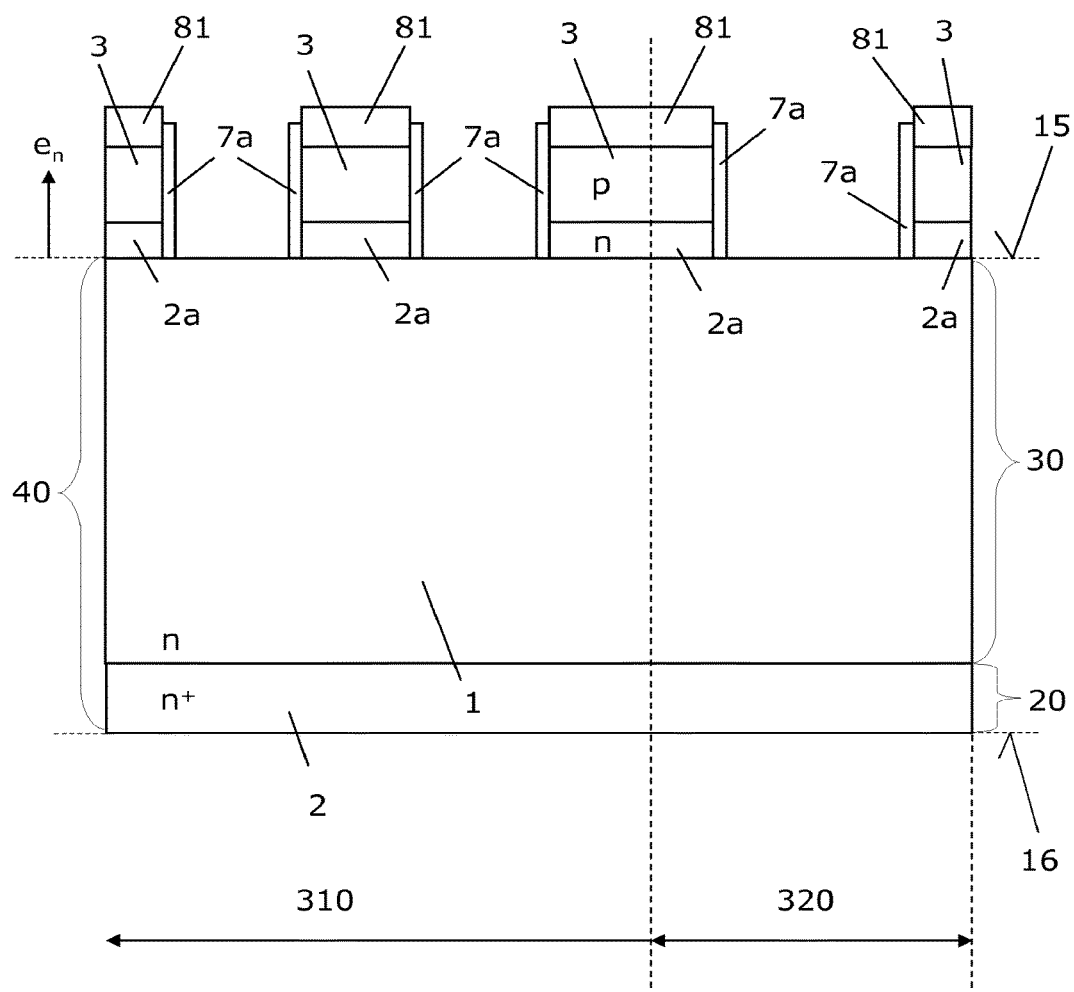

Thereafter, a further anisotropic silicon nitride etching process is carried out to partly expose the semiconductor body 40 between the spaced apart epitaxial regions 2a, 3. The resulting semiconductor device 300 is illustrated in FIG. 29. As shown, a trench hard mask 7a, 81 is formed. The trench hard mask 7a, 81 includes a dielectric layer 7a which, in the vertical cross-section, covers each of the sidewalls of the spaced apart epitaxial regions 2a, 3.

Thereafter, vertical trenches 17, 18, 19 are etched into the semiconductor body 40 using the trench hard mask 7a, 81 as etching mask. A field oxide 9 is formed on the side walls and the bottom walls of the vertical trenches 17, 18, 19. The field oxide 9 is typically formed by thermal oxidation.

Thereafter, a field plate 12 is formed in a lower portion of each of the vertical trenches 17, 18, 19. This may be done by depositing a conductive layer, for example a highly doped poly-silicon layer, and back-etching the conductive layer selectively to the trench hard mask 7 and the field oxide 9.

Figure 30:
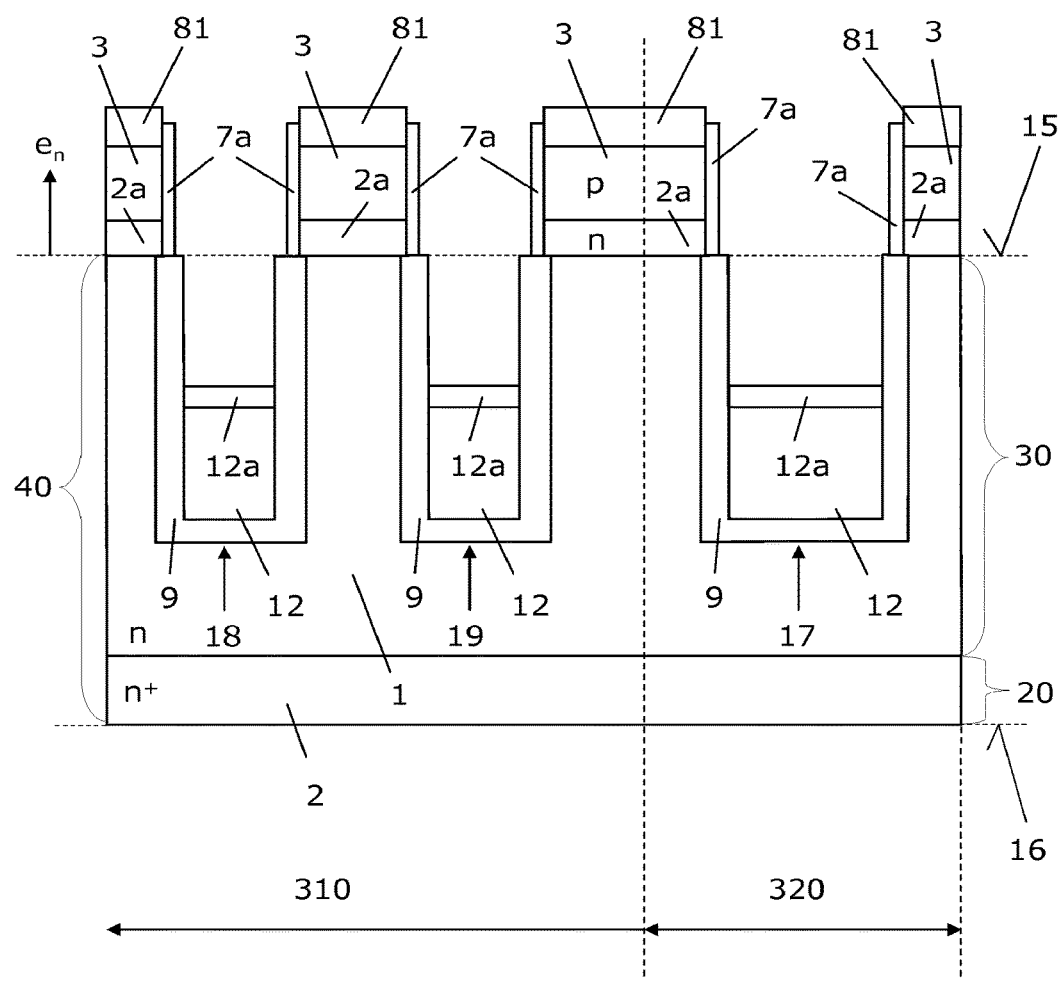

Thereafter, an insulating region 12a is formed on each of the field plates 12, for example by thermal oxidation of an upper portion of the back etched poly-silicon layer. In so doing, an insulated field plate is formed in each of the vertical trenches 17, 18, 19. The resulting semiconductor device 300 is illustrated in FIG. 30.

Figure 31:
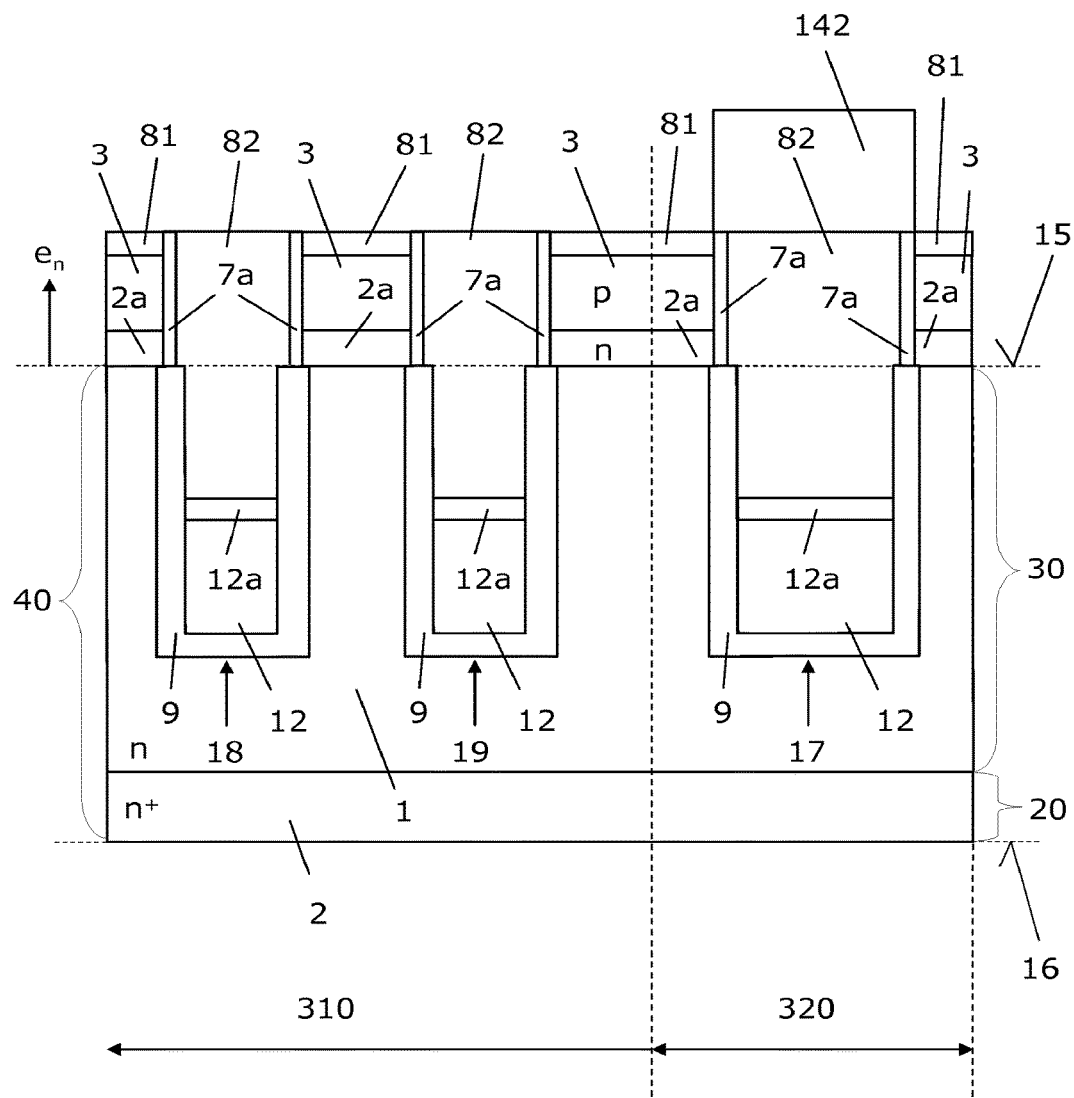

Thereafter, a dielectric filling 82, for example made of TEOS or an HDP-oxide, is deposited and polished back in a CMP-process. The resulting semiconductor device 300 is illustrated in FIG. 31 after covering the vertical trench 17 in the peripheral area 320 with a mask 142.

Figure 32:
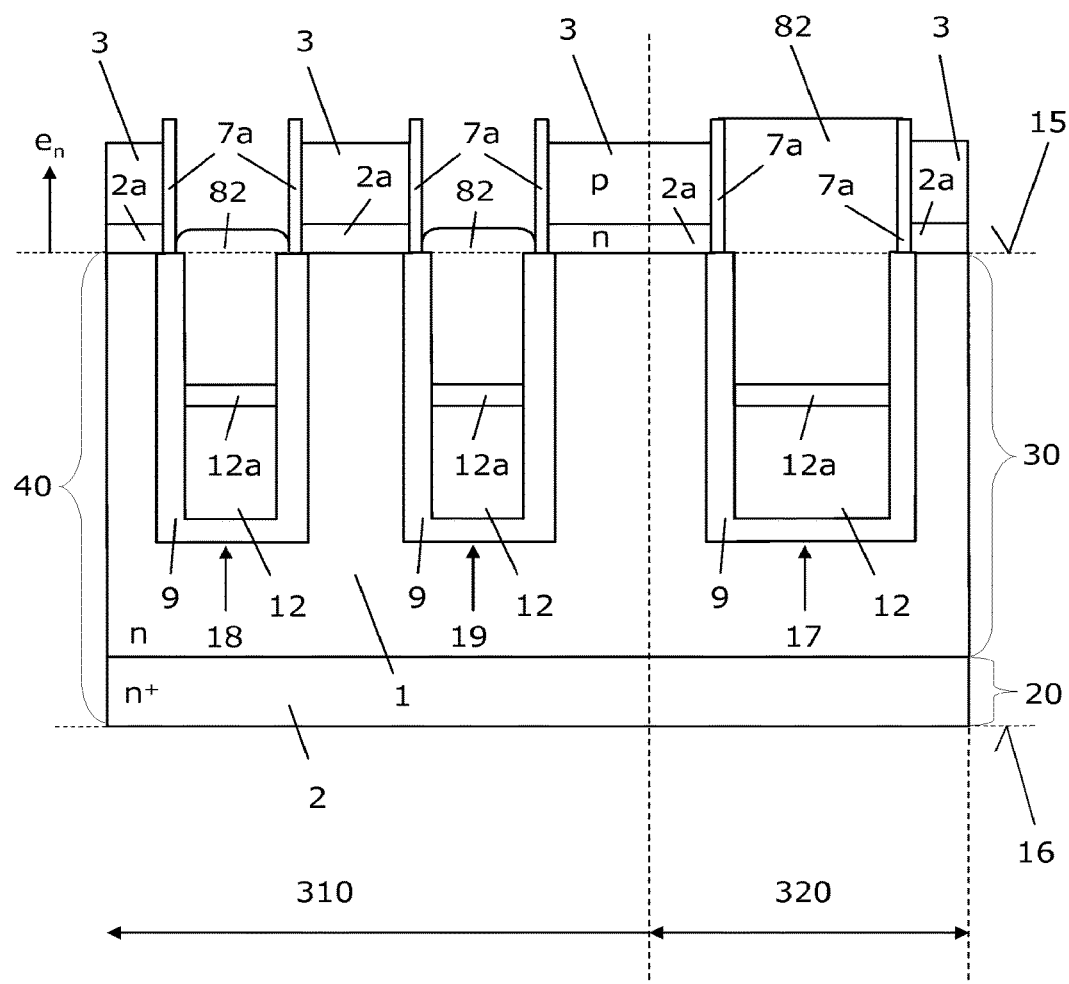

Thereafter, the thermal oxide 81 is removed and the dielectric filling 82 is etched back in the active area 310. The resulting semiconductor device 300 is illustrated in FIG. 32 after removal of the mask 142.

Figure 33:
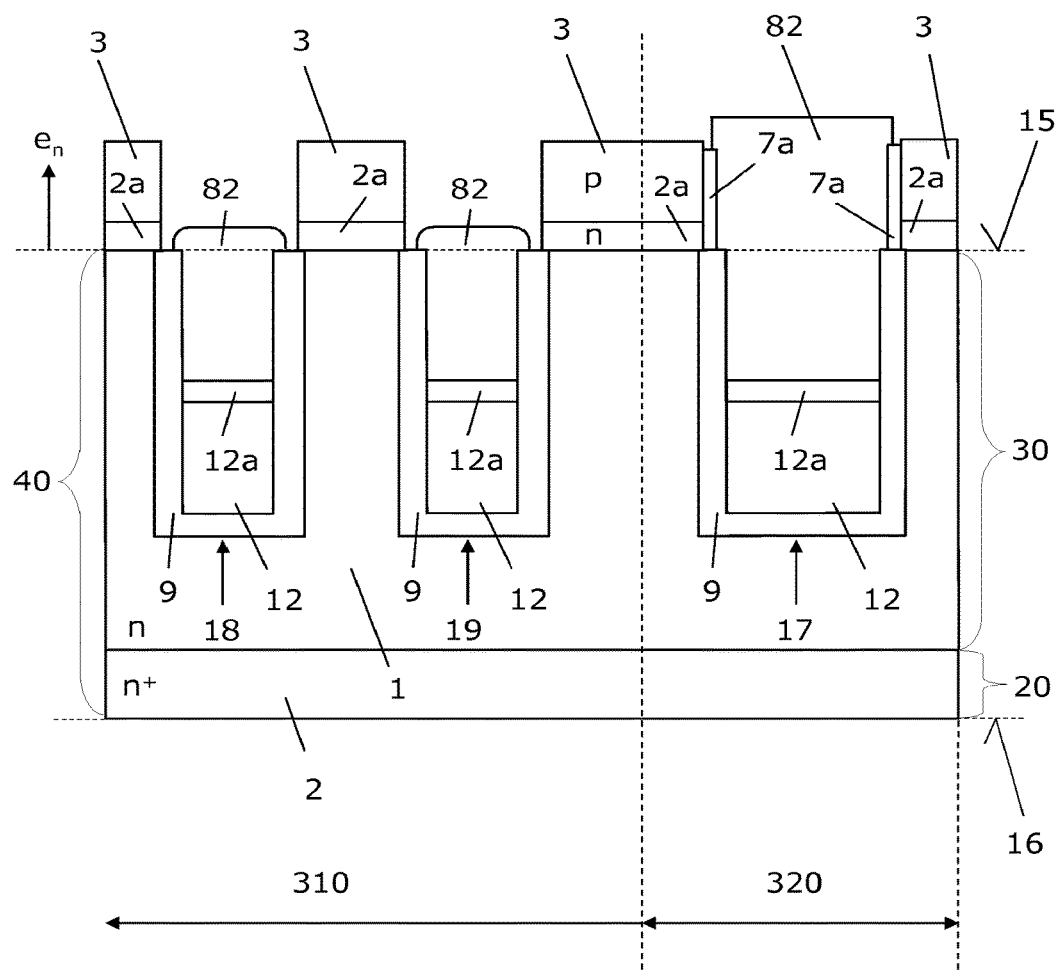

Thereafter, an isotropic silicon nitride etching is performed to expose the side walls of the epitaxial regions 2a, 3 in the active area 310. The resulting semiconductor device 300 is illustrated in FIG. 33.

Figure 34:
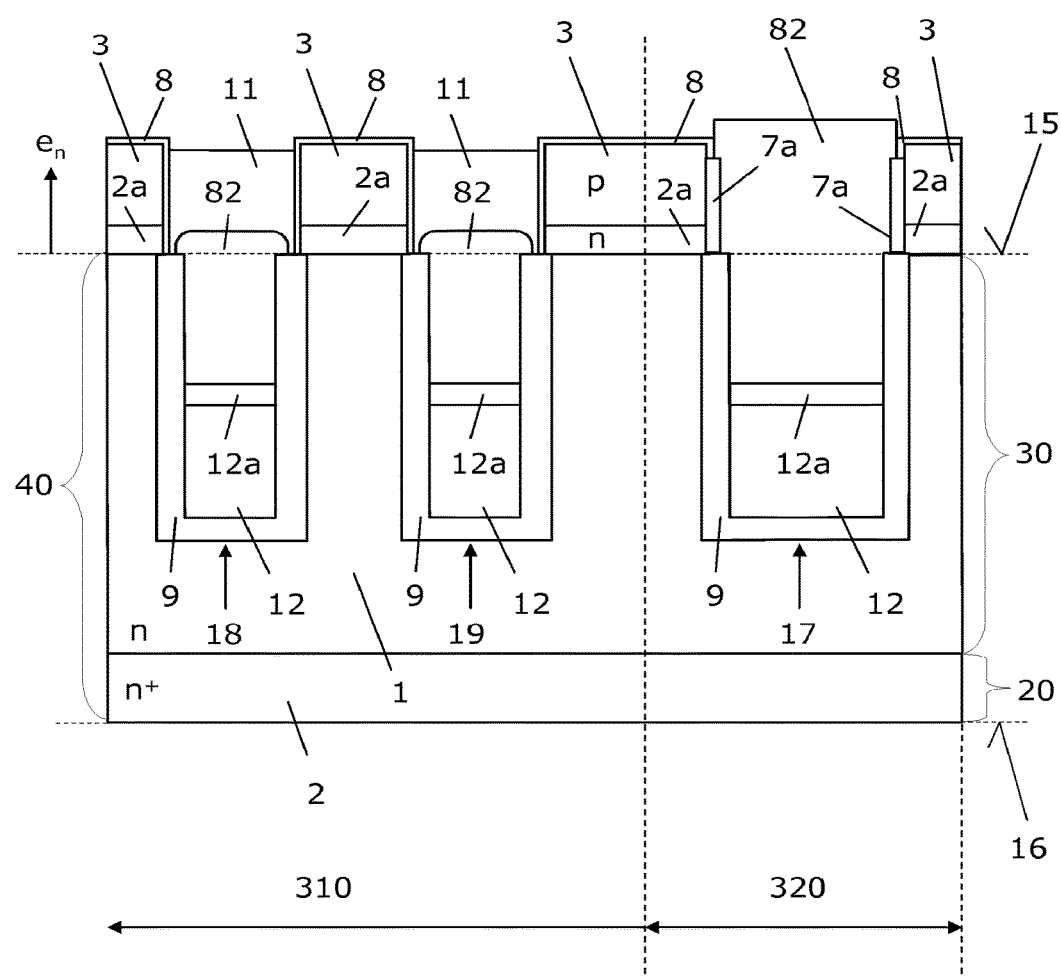

Thereafter, an insulated gate electrode 11 is formed above the insulated field plate 12 in each of the vertical trenches 18, 19 of the active area 310. Forming the insulated gate electrodes 11 typically includes forming a thin gate dielectric region 8 at the exposed side walls of the epitaxial regions 2a, 3, for example by thermal oxidation. This is typically followed by depositing a conductive material such as a highly doped poly-Si and partially back-etching the conductive material to form the gate electrodes 11. In so doing, the insulated gate electrodes are typically formed such that they are, in the vertical cross-section, arranged between respective spaced apart epitaxial regions 2a, 3. The resulting semiconductor device 300 is illustrated in FIG. 34. Accordingly, the insulated gate electrodes are only formed in the active area 310 of semiconductor device 300. The structure arranged in and on the vertical trench 17 in the peripheral area 320 typically forms an edge-termination structure for redistributing the electric field and electric potential, respectively, such that the blocking voltage of the semiconductor device 300 is maintained.

Thereafter, an insulating plug is formed on each of the gate electrodes 11, for example by thermal oxidation. Typically, the first semiconductor region 1 and the epitaxial regions 2a form a drift region, and the epitaxial regions 3 form body regions of the semiconductor device 300. Highly doped body contact regions 4 of the second conductivity type and highly doped source regions 5 of the first conductivity type are typically formed in the body regions 3, e.g. by implantation. A first electrode in ohmic contact with the body contact regions 4 and the source regions 5 is formed in the body region 3. A second electrode in ohmic contact with the second semiconductor region is formed on back surface 16. Depending on doping type of second semiconductor region, semiconductor device 300 may form a MOSFET or an IGBT.

Figure 35:
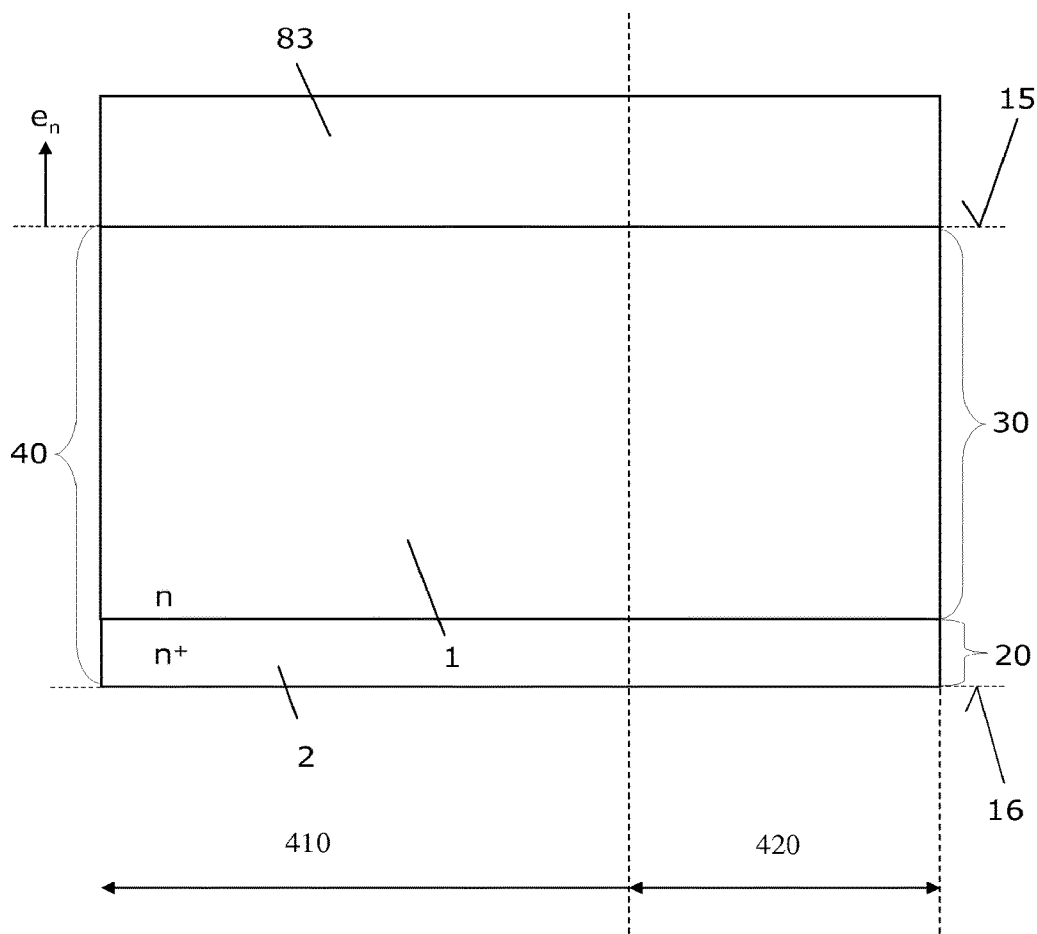
FIGS. 35 to 40 schematically illustrate, in vertical cross-sections, manufacturing processes according to one or more embodiments.

FIGS. 35 to 40 illustrate a method for forming a semiconductor device 400 according to several embodiments in vertical cross-sections. In a first process, a wafer or substrate 40 having a horizontal surface 15 and a first semiconductor layer 1 of the first conductivity type (n-type) is provided. Semiconductor layer 1 extends to the horizontal surface 15. The normal direction $e_n$ of the first surface 15 is substantially parallel to the vertical direction. A hard mask layer 83, typically a silicon oxide layer, is arranged on the horizontal surface 15. The hard mask layer 83 is typically formed by thermal oxidation and has a vertical extension of about 200 nm to about 500 nm. The resulting semiconductor device 400 is illustrated in FIG. 35.

The semiconductor device 400 is typically also a power semiconductor device having an active area 410 for carrying and/or switching a load current and a peripheral area 420 with appropriate field redistributing structures to maximize the blocking capability of the semiconductor device 400.

Figure 36:
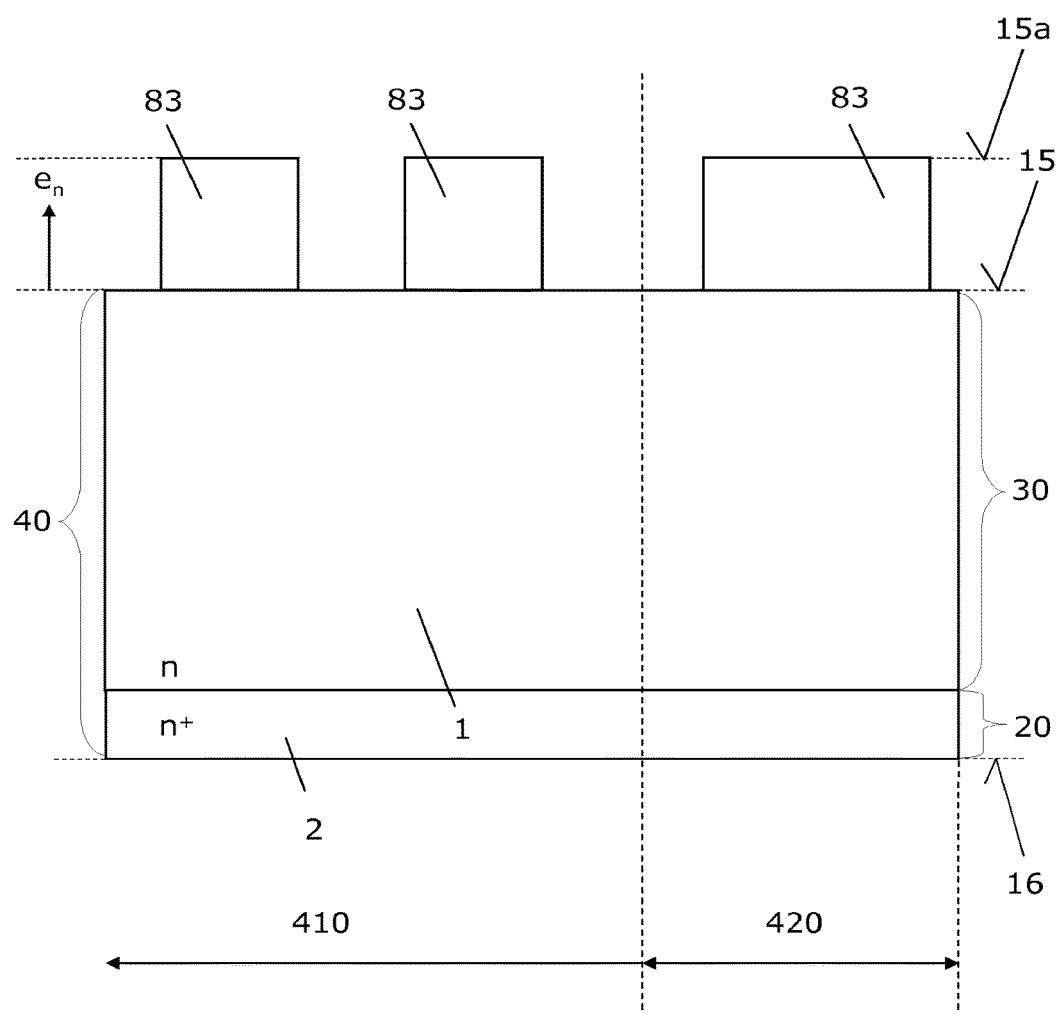

Thereafter, the hard mask layer 83 is structured using a photolithographically structured mask. Accordingly, an epitaxy hard mask 83 which extends from the horizontal surface 15 of the semiconductor body 40 to a further horizontal surface 15a is formed. The resulting semiconductor device 400 is illustrated in FIG. 36 after removing the photolithographically structured mask.

Figure 37:
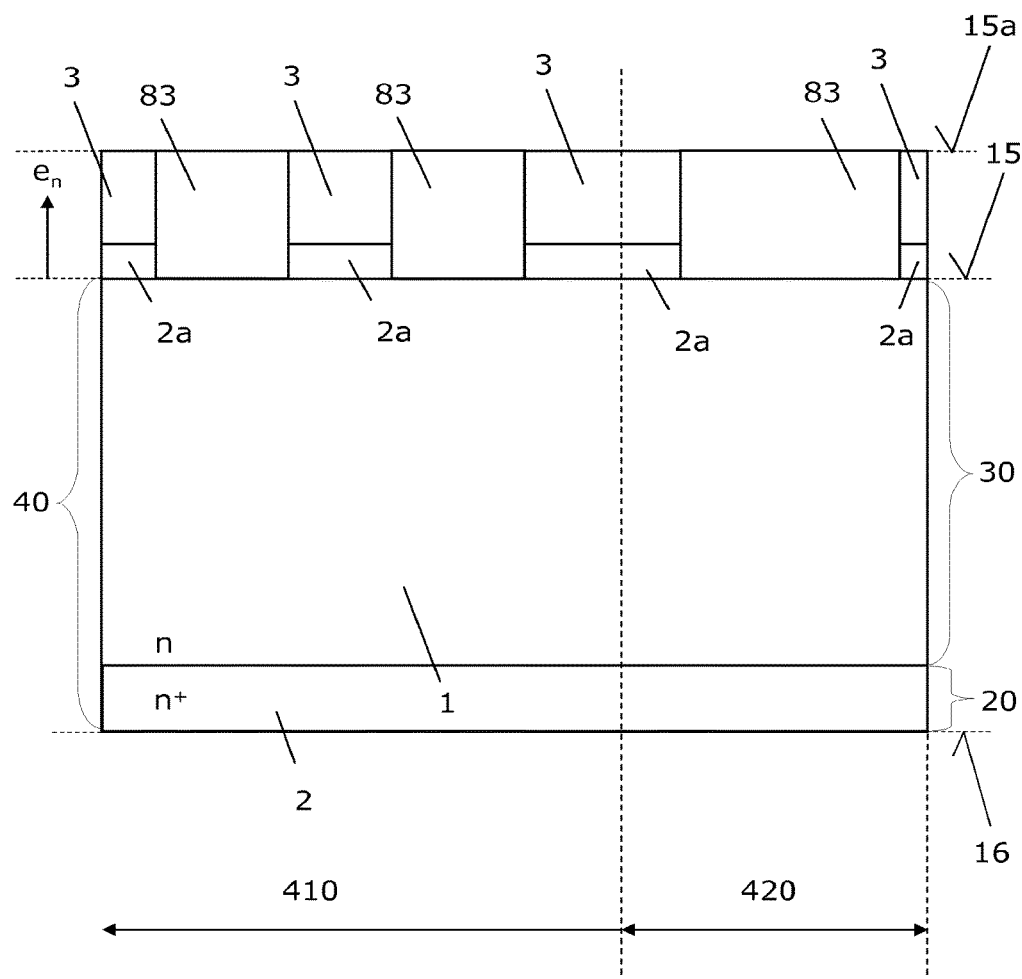

Thereafter, mono-crystalline silicon is deposited on the semiconductor body 40 by epitaxial deposition selective to the epitaxy hard mask 83 by selective epitaxy. The deposited mono-crystalline silicon is polished back to the epitaxy hard mask 83 so that, in the illustrated vertical cross-section, several spaced apart epitaxial regions 2a, 3 are formed which extend, in vertical direction, substantially up to the further horizontal surface 15a. In so doing, the height of the epitaxial regions 2a, 3 is defined by the height of the epitaxy hard mask 83. The resulting semiconductor device 400 is illustrated in FIG. 37.

Forming the epitaxial regions 2a, 3 typically includes forming epitaxial regions 2a of the first conductivity type on the semiconductor body 40 and epitaxial regions 3 of a second conductivity type (p-type) on the epitaxial regions 2a of the first conductivity type 2a. In so doing, a horizontally extending pn-junction is formed in each of the epitaxial regions 2a, 3. The epitaxial regions 2a and the semiconductor layer 1 typically later form a common drift region. Typically, the epitaxial regions 3 later form body regions.

Thereafter, the epitaxy hard mask 83 is removed selectively to the epitaxial regions 2a, 3 and the semiconductor body 40 so that, in the vertical cross-section, the sidewalls of the epitaxial regions 2a, 3 are exposed and so that, in the vertical cross-section, the semiconductor body 40 is exposed between the epitaxial regions 2a, 3. This is typically done by completely removing the epitaxy hard mask 83 in an etching process.

Figure 38:
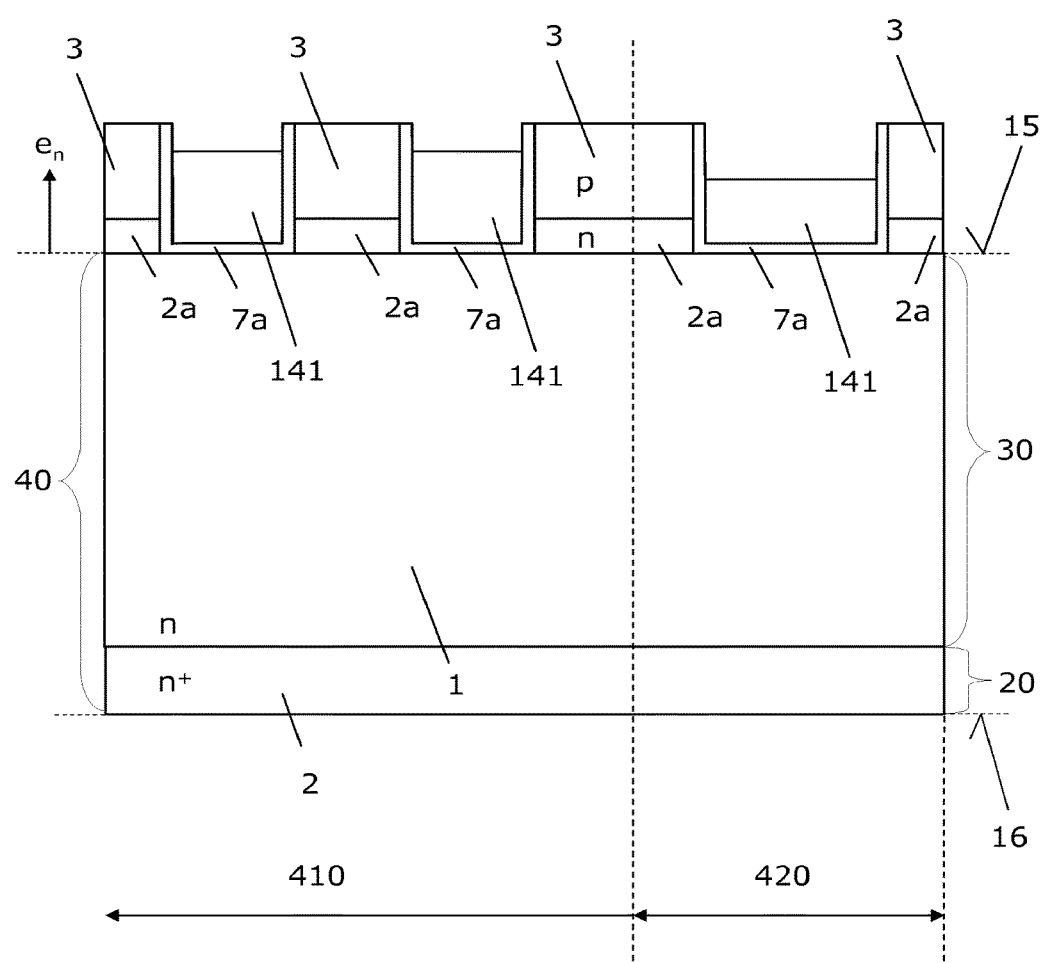

Thereafter, a thin silicon nitride layer 7a is conformly deposited. A resist 141 is deposited and etched back to cover the portions of the silicon nitride layer 7a which are directly arranged on the semiconductor body 40. Thereafter, an anisotropic silicone nitride etching is used to remove portions of the silicon nitride layer 7a which are arranged on top of the epitaxial regions 3. The resulting semiconductor device 400 is illustrated in FIG. 38.

Figure 39:
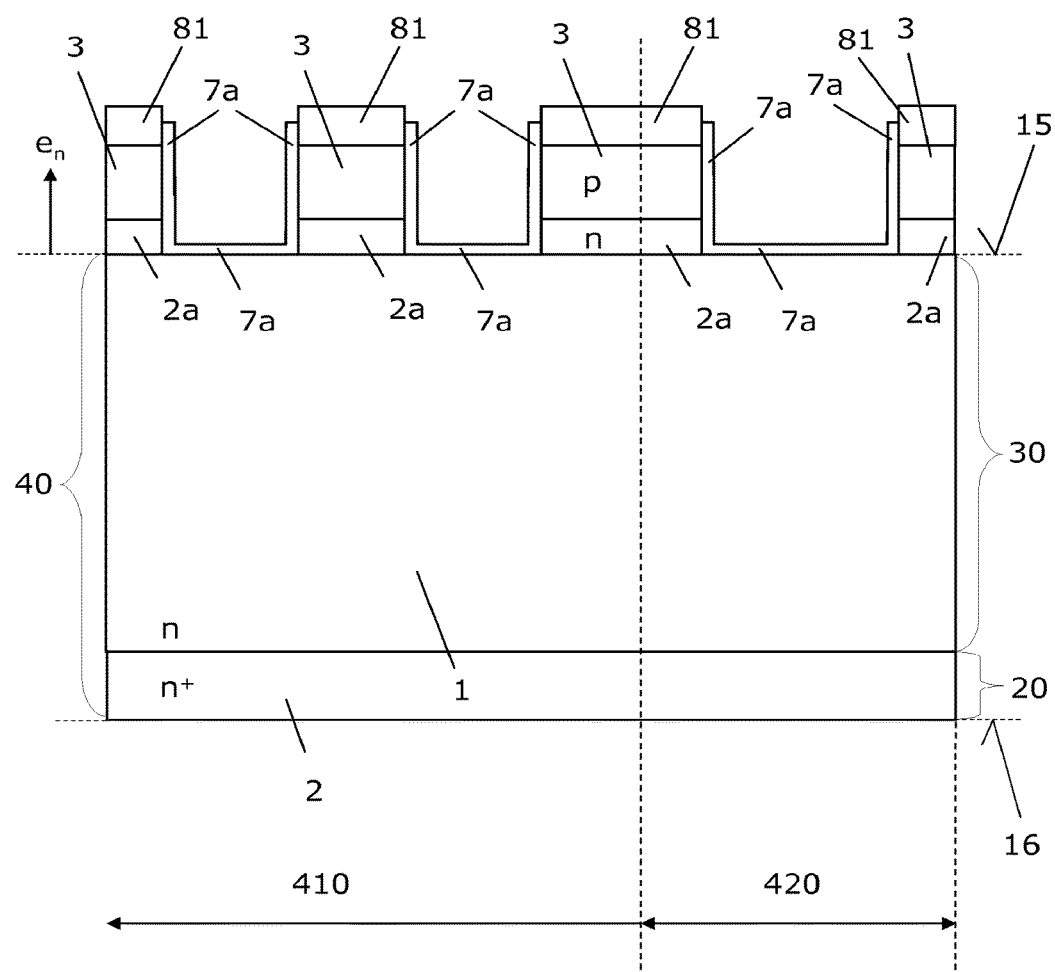

Thereafter, the resist 141 is removed, for example ashed, and a thermal oxide 81 is formed on the epitaxial regions 3. The thermal oxide 81 may be formed at a temperature of about 900° C. The vertical extension of the thermal oxide 81 may be about 100 nm. The resulting semiconductor device 400 is illustrated in FIG. 39.

Figure 40:
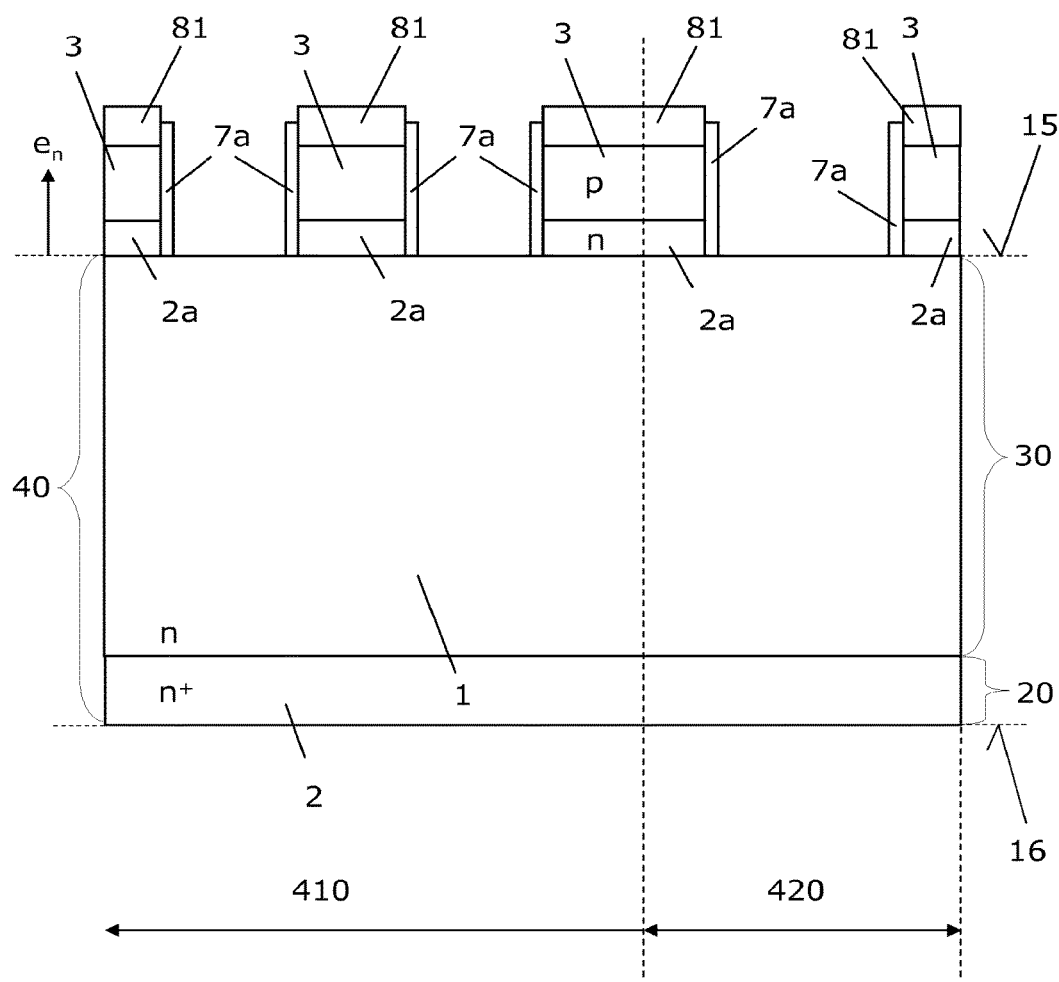

Thereafter, a further anisotropic silicone nitride etching is used to remove the portions of the silicon nitride layer 7a which are directly arranged on the semiconductor body 40. Thereby, a trench hard mask 7a, 81, which includes the silicon nitride layer 7a and the thermal oxide 81, is formed self-aligned to the epitaxial regions 2a, 3. The resulting semiconductor device 400 is illustrated in FIG. 40. Semiconductor device 400 illustrated in FIG. 40 is similar to semiconductor device 300 illustrated in FIG. 29.

Thereafter, further processes as explained for semiconductor device 300 with reference to FIGS. 30 to 34 are typically also performed for semiconductor device 400 to form a MOSFET or an IGBT. Vertical trenches are etched into semiconductor body 40 using the trench hard mask 7*a*, 81 as an etching mask. A field plate is formed in a lower portion of each of the vertical trenches and insulated gate electrodes are formed above the vertical trenches in the active area 410 but typically not in the peripheral area 420.

The methods for forming the semiconductor devices 300 and 400 have in common that the trench hard mask is formed self-aligned to the epitaxial region, and that the vertical trenches are etched into the semiconductor body using the trench hard mask as an etching mask. Furthermore, the methods for forming the semiconductor devices 300 and 400 have in common that the epitaxy hard mask is removed selectively to the epitaxial region prior to forming the trench hard mask. Thereby, the variation of the Miller capacitance of the gate electrodes and the gate-drain charge Qgd, respectively, is typically kept small. This allows optimizing the design of semiconductor devices 300, 400 such that the Miller capacitance is reduced without unfavorable variation for the different gate electrodes 11. Accordingly, switching losses of semiconductor device 300, 400 may be reduced. Furthermore, the vertical extension of the body regions 3 may be chosen comparatively small, for example between about 150 nm and 250 nm. This is due to low height variation of body regions 3 which is due to using the epitaxy hard mask as a CMP-stop which defines the height of the epitaxial regions 2*a*, 3. Accordingly, the length of the channel region, which may be formed during device operation, may be chosen comparatively small and with a low variation of a few nm only. Thus, on-state losses of semiconductor devices 300, 400 may significantly be reduced.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for forming a semiconductor device, comprising:
   providing a semiconductor body having a horizontal surface;
   forming an epitaxy hard mask on the horizontal surface;
   depositing a semiconductor material on the semiconductor body by epitaxial deposition selective to the epitaxy hard mask by selective epitaxy so that, in a vertical cross-section, at least two spaced apart epitaxial regions are formed;
   removing the epitaxy hard mask selective to the semiconductor material so that, in the vertical cross-section, sidewalls of the at least two spaced apart epitaxial regions are exposed;
   forming a trench hard mask comprising forming a dielectric layer so that, in the vertical cross-section, each of the sidewalls of the at least two spaced apart epitaxial regions is covered by the dielectric layer;
   etching a vertical trench into the semiconductor body using the trench hard mask as an etching mask; and
   forming an insulated gate electrode which is, in the vertical cross-section, arranged between the at least two spaced apart epitaxial regions.

2. The method of claim 1, further comprising polishing the semiconductor material back to the epitaxy hard mask.

3. The method of claim 1, wherein forming the epitaxy hard mask comprises at least one of:
   forming a thermal oxide layer; and
   depositing a nitride layer and depositing a TEOS layer.

4. The method of claim 1, further comprising forming an insulated field plate in a lower portion of the vertical trench.

5. The method of claim 1, wherein the semiconductor device comprises an active area and a peripheral area, the method further comprising:
   forming a plurality of vertical trenches in the active area and at least one vertical trench in the peripheral area; and
   forming insulated gate electrodes only in the active area.

6. The method of claim 1, wherein the epitaxy hard mask has a vertical extension of about 300 nm to about 600 nm.

7. The method of claim 1, wherein the epitaxy hard mask comprises at least one of a thermal oxide layer, a TEOS layer, an undoped silicate glass layer, a high density plasma oxide layer, and a doped oxide layer.

* * * * *